United States Patent
Shim et al.

(10) Patent No.: US 9,871,146 B2
(45) Date of Patent: Jan. 16, 2018

(54) SOLAR CELL AND METHOD FOR MANUFACTURING THE SAME

(75) Inventors: Seunghwan Shim, Seoul (KR); Kisu Kim, Seoul (KR); Eunae Yoon, Seoul (KR); Yuju Hwang, Seoul (KR); Younghyun Lee, Seoul (KR); Sangwook Park, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 13/560,723

(22) Filed: Jul. 27, 2012

(65) Prior Publication Data

US 2013/0118571 A1    May 16, 2013

(30) Foreign Application Priority Data

Nov. 16, 2011    (KR) .................. 10-2011-0119640

(51) Int. Cl.
   *H01L 31/0216*    (2014.01)
   *H01L 31/0236*    (2006.01)
   (Continued)

(52) U.S. Cl.
   CPC .. *H01L 31/02168* (2013.01); *H01L 31/02363* (2013.01); *H01L 31/022433* (2013.01); *H01L 31/068* (2013.01); *Y02E 10/547* (2013.01)

(58) Field of Classification Search
   CPC .................. H01L 31/02167–31/02168; H01L 31/022441–31/022458; H01L 31/0682;
   (Continued)

(56) References Cited

U.S. PATENT DOCUMENTS

2008/0092944 A1\* 4/2008 Rubin ............ H01L 31/022425
                                                                      136/252
2009/0277502 A1\* 11/2009 Yoshida ............ H01L 31/02168
                                                                      136/256
(Continued)

FOREIGN PATENT DOCUMENTS

DE          4217428 A1 \*   6/1993
DE    102009024807 B3 \*  10/2010
(Continued)

OTHER PUBLICATIONS

DE 4217428 A1 English Translation.\*
(Continued)

*Primary Examiner* — Liesl C Baumann
(74) *Attorney, Agent, or Firm* — Birch, Stewart, Kolasch & Birch, LLP

(57) ABSTRACT

A solar cell includes a substrate formed of n-type single crystal silicon, an emitter region of a p-type which is positioned at a first surface of the substrate and includes a first emitter region having a first sheet resistance and a second emitter region having a second sheet resistance less than the first sheet resistance, a plurality of surface field regions of the n-type locally positioned at a second surface opposite the first surface of the substrate, a plurality of first electrodes which are positioned only on the second emitter region to be separated from one another and are connected to the second emitter region, and a plurality of second electrodes which are positioned on the plurality of surface field regions to be separated from one another and are connected to the plurality of surface field regions.

19 Claims, 17 Drawing Sheets

(51) Int. Cl.
*H01L 31/0224* (2006.01)
*H01L 31/068* (2012.01)

(58) Field of Classification Search
CPC .......... H01L 31/0516; H01L 31/02363; H01L 31/068; H01L 31/022433; Y02E 10/547
USPC .................................................. 136/243–265
See application file for complete search history.

(56) References Cited

U.S. PATENT DOCUMENTS

| | | | |
|---|---|---|---|
| 2010/0024880 A1* | 2/2010 | Lee | 136/256 |
| 2010/0218800 A1* | 9/2010 | Cousins | 136/244 |
| 2010/0243041 A1* | 9/2010 | Carlson et al. | 136/255 |
| 2010/0258177 A1* | 10/2010 | Ko et al. | 136/256 |
| 2010/0319763 A1 | 12/2010 | Park et al. | |
| 2011/0061732 A1* | 3/2011 | Yang et al. | 136/258 |
| 2011/0100459 A1* | 5/2011 | Yoon et al. | 136/259 |
| 2011/0136285 A1* | 6/2011 | Kim | 438/57 |
| 2011/0139226 A1 | 6/2011 | Ha et al. | |
| 2011/0139236 A1 | 6/2011 | Lee et al. | |
| 2011/0139243 A1* | 6/2011 | Shim | H01L 31/02168 136/259 |
| 2011/0140226 A1* | 6/2011 | Jin et al. | 257/460 |
| 2011/0183459 A1* | 7/2011 | Kim et al. | 438/72 |
| 2011/0197964 A1* | 8/2011 | Jang et al. | 136/256 |
| 2011/0265870 A1 | 11/2011 | Park et al. | |
| 2012/0073647 A1* | 3/2012 | Stangl et al. | 136/256 |
| 2013/0284259 A1* | 10/2013 | Jin et al. | 136/256 |

FOREIGN PATENT DOCUMENTS

| | | |
|---|---|---|
| KR | 10-1998-0072419 A | 11/1998 |
| KR | 10-2010-0136208 A | 12/2010 |
| KR | 10-1046219 B1 | 7/2011 |

OTHER PUBLICATIONS

Wang et al., "24% efficient silicon solar cells," Applied Physics Letters, vol. 57, No. 6, Aug. 6, 1990, pp. 602-604, XP000150177.

\* cited by examiner (a)

(b)

SOLAR CELL AND METHOD FOR MANUFACTURING THE SAME

This application claims priority to and the benefit of Korean Patent Application No. 10-2011-0119640, filed in the Korean Intellectual Property Office on Nov. 16, 2011, the entire contents of which are incorporated herein by reference.

BACKGROUND OF THE INVENTION

Field of the Invention

Embodiments of the invention relate to a solar cell and a method for manufacturing the same.

Description of the Related Art

Recently, as existing energy sources such as petroleum and coal are expected to be depleted, interests in alternative energy sources for replacing the existing energy sources are increasing. Among the alternative energy sources, solar cells for generating electric energy from solar energy have been particularly spotlighted.

A solar cell generally includes semiconductor parts, which respectively have different conductive types, for example, a p-type and an n-type and thus form a p-n junction, and electrodes respectively connected to the semiconductor parts of the different conductive types.

When light is incident on the solar cell, electron-hole pairs are produced in the semiconductor parts. The electrons move to the n-type semiconductor part, and the holes move to the p-type semiconductor part under the influence of the p-n junction of the semiconductor parts. Then, the electrons and the holes are collected by the different electrodes respectively connected to the n-type semiconductor part and the p-type semiconductor part. The electrodes are connected to each other using electric wires to thereby obtain electric power.

SUMMARY OF THE INVENTION

In one aspect, there is a solar cell including a substrate formed of n-type single crystal silicon, an emitter region of a p-type positioned at a first surface of the substrate, the emitter region including a first emitter region having a first sheet resistance and a second emitter region having a second sheet resistance less than the first sheet resistance, a plurality of surface field regions of the n-type locally positioned at a second surface opposite the first surface of the substrate, a plurality of first electrodes which are positioned only on the second emitter region to be separated from one another and are connected to the second emitter region, and a plurality of second electrodes which are positioned only on the plurality of surface field regions to be separated from one another and are connected to the plurality of surface field regions.

The solar cell may further include a first anti-reflection layer which is positioned on the emitter region, on which the plurality of first electrodes are not positioned, and is formed of aluminum oxide, and a second anti-reflection layer which is positioned on the first anti-reflection layer and is formed of silicon nitride.

The solar cell may further include a first passivation layer which is positioned on the second surface of the substrate, on which the plurality of second electrodes are not positioned, and is formed of silicon nitride, and a second passivation layer which is positioned on the first passivation layer and is formed of aluminum oxide.

The first anti-reflection layer and the second passivation layer may have the same material, refractive index, thickness, and composition.

At least one of the first anti-reflection layer and the second passivation layer may be additionally positioned on a third surface other than the first and second surfaces of the substrate. The first anti-reflection layer and the second passivation layer may be connected to each other.

The second anti-reflection layer may be additionally positioned on at least one of the first anti-reflection layer and the second passivation layer positioned on the third surface of the substrate.

The plurality of surface field regions may each have a dot shape. In this instance, a pitch between two adjacent surface field regions may be about 0.03 mm to 0.11 mm.

The plurality of surface field regions may each have a stripe shape extending in a fixed direction. In this instance, a pitch between two adjacent surface field regions may be about 0.1 mm to 0.6 mm.

At least one of the first and second surfaces of the substrate may be an incident surface.

The solar cell may further include a reflection layer positioned on the plurality of second electrodes and between adjacent second electrodes.

The reflection layer may be formed of a metal material.

For example, the reflection layer may be formed of aluminum (Al), silver (Ag), an alloy (Al:Ag) of aluminum (Al) and silver (Ag), an Al alloy or copper (Cu).

The first surface of the substrate may be an incident surface, and the second surface of the substrate may be a non-incident surface.

In another aspect, there is a method for manufacturing a solar cell including injecting p-type impurities into a substrate of an n-type formed of single crystal silicon to form an emitter layer of a p-type on a first surface of the substrate, forming a first silicon nitride layer formed of silicon nitride on a second surface opposite the first surface of the substrate, forming first and second aluminum oxide layers formed of aluminum oxide on the first silicon nitride layer and the emitter layer, respectively, forming a second silicon nitride layer formed of silicon nitride on the second aluminum oxide layer formed on the emitter layer, coating a first impurity layer containing the p-type impurities on the second silicon nitride layer, irradiating a first laser beam onto the first impurity layer containing the p-type impurities to form an emitter region using the emitter layer to include a first emitter region having a first sheet resistance and a second emitter region having a second sheet resistance less than the first sheet resistance, and to form a first opening which passes through the second aluminum oxide layer and the second silicon nitride layer and exposes the second emitter region, forming a plurality of first electrodes on the second emitter region exposed by the first opening, coating a second impurity layer containing n-type impurities on the first aluminum oxide layer, irradiating a second laser beam onto the second impurity layer containing the n-type impurities to form a surface field region having an impurity doping concentration higher than the substrate at the second surface of the substrate, and to form a second opening which passes through the first aluminum oxide layer and the first silicon nitride layer and exposes the surface field region, and forming a plurality of second electrodes on the surface field region exposed by the second opening.

In yet another aspect, there is a method for manufacturing a solar cell including injecting p-type impurities into a substrate of an n-type formed of single crystal silicon to form an emitter layer of a p-type on a first surface of the substrate, forming a doping prevention layer including an opening, which exposes a portion of a second surface opposite the first surface of the substrate, on the second surface of the substrate, diffusing a process gas containing n-type impurities into the second surface of the substrate having the doping prevention layer to form a surface field region having an impurity doping concentration higher than the substrate at a portion of the second surface of the substrate exposed by the opening, removing the doping prevention layer, forming a first silicon nitride layer formed of silicon nitride on the second surface of the substrate having the surface field region, forming first and second aluminum oxide layers formed of aluminum oxide on the first silicon nitride layer and the emitter layer, respectively, forming a second silicon nitride layer formed of silicon nitride on the second aluminum oxide layer formed on the emitter layer, coating an impurity layer containing the p-type impurities on a portion of the second silicon nitride layer, irradiating a laser beam onto the impurity layer containing the p-type impurities to form an emitter region using the emitter layer to include a first emitter region having a first sheet resistance and a second emitter region having a second sheet resistance less than the first sheet resistance and to form a first opening which passes through the second aluminum oxide layer and the second silicon nitride layer and exposes the second emitter region, forming a plurality of first electrodes on the second emitter region exposed by the first opening, irradiating the laser beam onto a portion of the first aluminum oxide layer and a portion of the first silicon nitride layer underlying the first aluminum oxide layer to form a second opening which passes through the portion of the first aluminum oxide layer and the portion of the first silicon nitride layer and exposes the surface field region, and forming a plurality of second electrodes on the surface field region exposed by the second opening.

The first and second aluminum oxide layers may have the same material, refractive index, thickness, and composition.

At least one of the first and second aluminum oxide layers may be additionally formed on a third surface other than the first and second surfaces of the substrate.

A portion of the emitter layer underlying the impurity layer, onto which the first laser beam is irradiated, may be the second emitter region, and a portion of the emitter layer, onto which the first laser beam is not irradiated and which is not positioned under the impurity layer, may be the first emitter region. The first opening may be formed in a portion of the second aluminum oxide layer and a portion of the second silicon nitride layer underlying the first impurity layer, onto which the first laser beam is irradiated.

The surface field region may be formed at the second surface of the substrate underlying the second impurity layer, onto which the second laser beam is irradiated. The second opening may be formed in a portion of the first aluminum oxide layer and a portion of the first silicon nitride layer underlying the second impurity layer, onto which the second laser beam is irradiated.

The plurality of first and second electrodes may be formed using a plating method.

The method may further include forming a reflection layer on the plurality of second electrodes and on the second aluminum oxide layer positioned between the adjacent second electrodes.

The reflection layer may be formed of a metal material using a sputtering method or an evaporation method.

The reflection layer may have a density larger than a density of a back electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Figure 1:
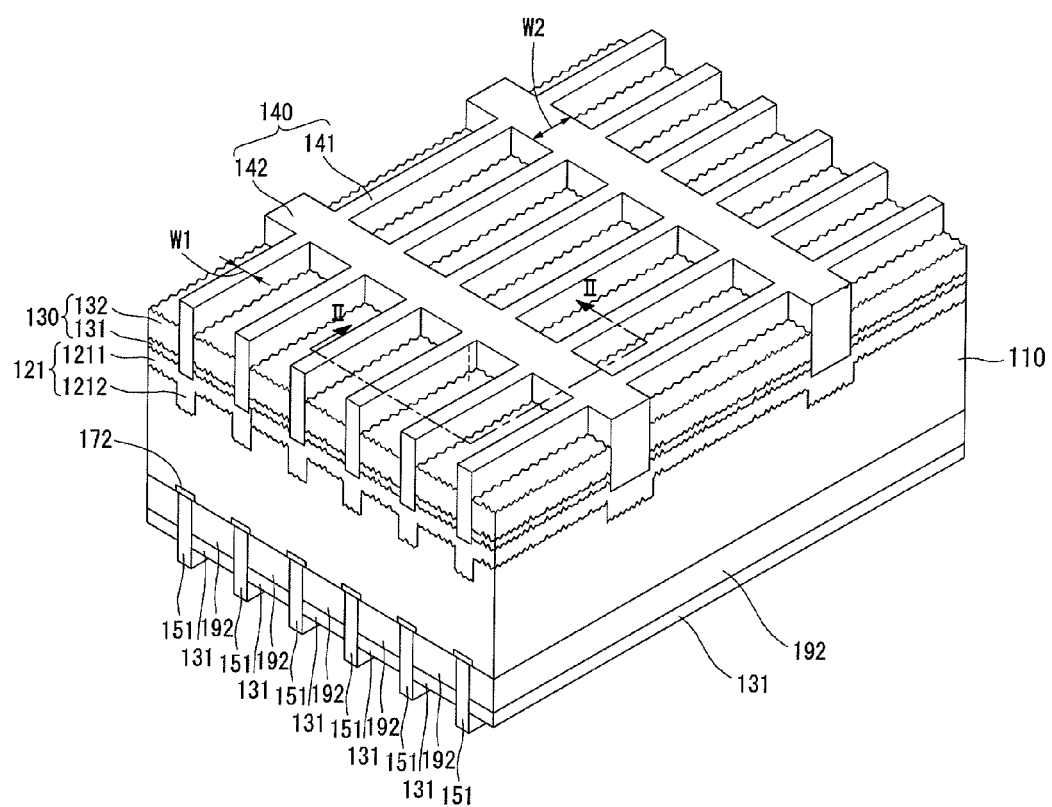
FIG. 1 is a partial perspective view of a solar cell according to an example embodiment of the invention.

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. A detailed description of known arts will be omitted if it is determined that such description of the known arts leads to obscuring of the embodiments of the invention.

In the drawings, the thickness of layers, films, panels, regions, etc., are exaggerated for clarity. It will be understood that when an element such as a layer, film, region, or substrate is referred to as being "on" another element, it can be directly on the other element or intervening elements may also be present. In contrast, when an element is referred to as being "directly on" another element, there are no intervening elements present.

Example embodiments of the invention will be described with reference to FIGS. 1 to 11C.

A solar cell according to an example embodiment of the invention is described in detail with reference to FIGS. 1 to 3.

As shown in FIG. 1, a solar cell according to an example embodiment of the invention includes a substrate 110, an emitter region 121 positioned at an incident surface (hereinafter, referred to as "a front surface or a first surface") of the substrate 110 on which light is incident, a plurality of back surface field (BSF) regions 172 positioned at a surface (hereinafter, referred to as "a back surface or a second surface") opposite the first surface of the substrate 110, a passivation layer 192 positioned on the back surface of the substrate 110, an anti-reflection layer 130 which is positioned on the emitter region 121 (i.e., on the front surface of the substrate 110), on a lateral surface (or a third surface) of the substrate 110, and on the passivation layer 192 positioned on the back surface of the substrate 110, a front electrode part (or a first electrode part) 140 which is positioned on the front surface of the substrate 110, which passes through the anti-reflection layer 130, and is connected to the emitter region 121, and a plurality of back electrodes (or second electrodes) 151 which are positioned on the back surface of the substrate 110 and are connected to the back surface field regions 172.

The substrate 110 is a semiconductor substrate formed of a semiconductor such as first conductive type silicon, for example, n-type silicon, though not required. The semiconductor used in the substrate 110 is a crystalline semiconductor, such as single crystal silicon and polycrystalline silicon. The n-type substrate 110 is doped with impurities of a group V element such as phosphorus (P), arsenic (As), and antimony (Sb).

Figure 2:
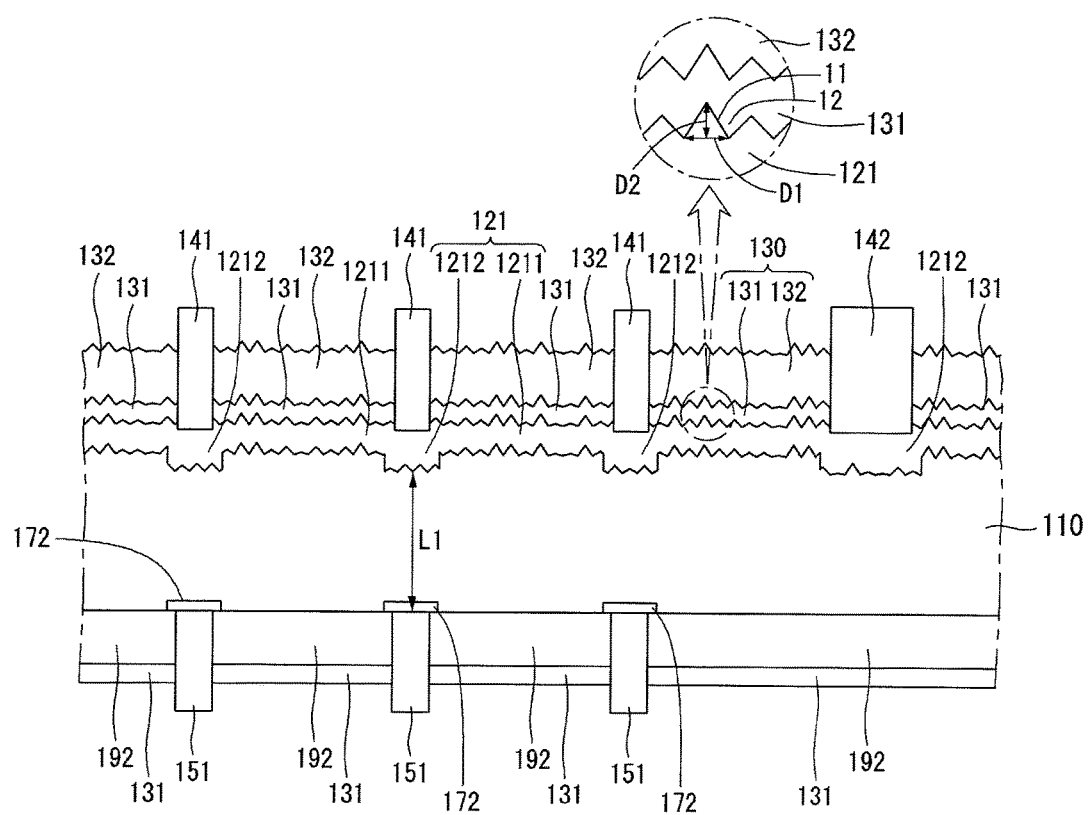
FIG. 2 is a cross-sectional view taken along line II-II of FIG. 1.
Figure 3:
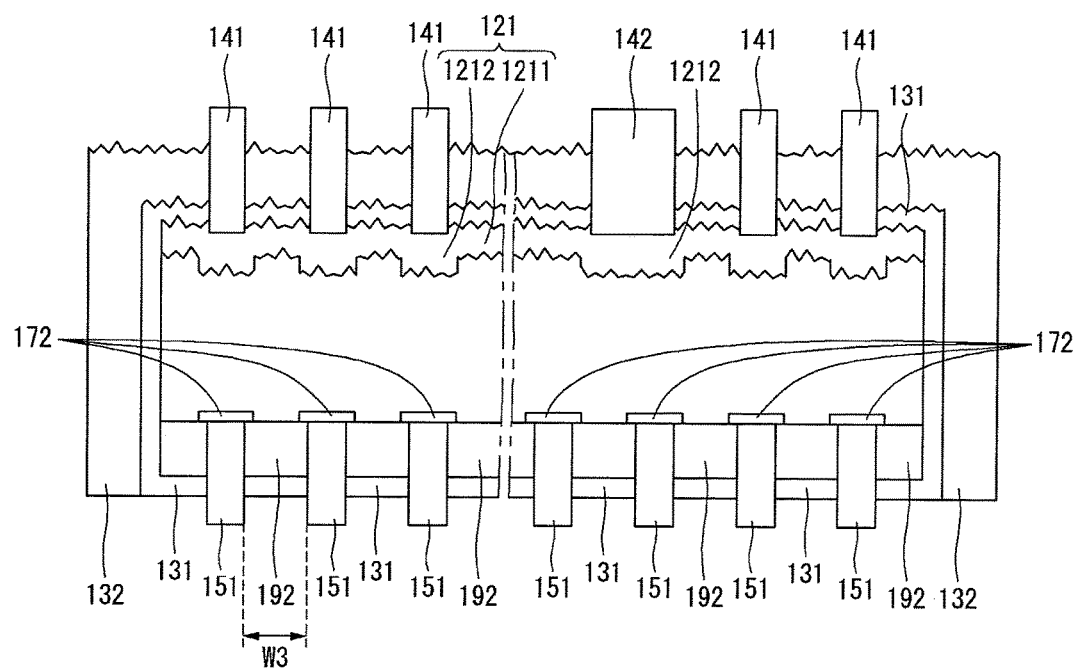
FIG. 3 is a schematic cross-sectional view entirely illustrating a solar cell according to an example embodiment of the invention.

As shown in FIGS. 1 to 3, a separate texturing process is performed on the flat front surface of the substrate 110 to form a textured surface corresponding to an uneven surface having a plurality of protrusions 11 and a plurality of depressions 12, or having uneven characteristics. In this instance, the emitter region 121 and the anti-reflection layer 130 positioned on the front surface of the substrate 110 have the textured surface.

As described above, because the front surface of the substrate 110 is textured, an incident area of the substrate 110 increases and a light reflectance decreases due to a plurality of reflection operations resulting from the textured surface. Hence, an amount of light incident on the substrate 110 increases, and the efficiency of the solar cell is improved.

As shown in FIGS. 1 to 3, maximum diameters D1 and maximum heights D2 of the plurality of protrusions 11 of the textured surface of the substrate 110 are non-uniformly determined. Therefore, the plurality of protrusions 11 have the different maximum diameters D1 and the different maximum heights D2.

The emitter region 121 positioned at the front surface of the substrate 110 is an impurity region doped with impurities of a second conductive type (for example, p-type) opposite the first conductive type (for example, n-type) of the substrate 110. Thus, the emitter region 121 of the second conductive type forms a p-n junction along with a first conductive type region (for example, an n-type region) of the substrate 110.

The emitter region 121 includes a first emitter region 1211 and a second emitter region 1212 each having a different impurity doping thickness (i.e., a different impurity doping concentration).

In the embodiment of the invention, an impurity doping thickness of the first emitter region 1211 is less than an impurity doping thickness of the second emitter region 1212. Thus, an impurity doping concentration of the first emitter region 1211 is less than an impurity doping concentration of the second emitter region 1212. For example, the first emitter region 1211 may have the thickness of about 200 nm to 500 nm as measured from the front surface of the substrate 110, and the second emitter region 1212 may have the thickness of about 400 nm to 700 nm as measured from the front surface of the substrate 110

In the embodiment of the invention, it may be considered that the thicknesses existing within the margin of error obtained by a difference between the heights of the uneven portions of the textured surface of the substrate 110 are substantially equal to one another.

Sheet resistances of the first and second emitter regions 1211 and 1212 are different from each other because of a difference between the impurity doping thicknesses of the first and second emitter regions 1211 and 1212. In general, a sheet resistance is inversely proportional to an impurity doping thickness. Therefore, in the embodiment of the invention, because the impurity doping thickness of the first emitter region 1211 is less than the impurity doping thickness of the second emitter region 1212, the sheet resistance of the first emitter region 1211 is greater than the sheet resistance of the second emitter region 1212. For example, the sheet resistance of the first emitter region 1211 may be about 80 $\Omega$/sq. to 150 $\Omega$/sq., and the sheet resistance of the second emitter region 1212 may be about 30 $\Omega$/sq. to 70 $\Omega$/sq.

The sheet resistances of the first and second emitter regions 1211 and 1212 may be determined in consideration of a loss amount of current in a p-n junction region and a contact resistance between the front electrode part 140 and the first and second emitter regions 1211 and 1212.

In this instance, because the emitter region 121 is formed by the diffusion of impurities into the substrate 110, a junction surface between the substrate 110 and the emitter region 121 is not flat and has an uneven surface in conformity with the shape of the textured front surface of the substrate 110

Regarding carriers, for example, electrons and holes of the electron-hole pairs produced by light incident on the substrate 110, the electrons and the holes respectively move to the n-type semiconductor and the p-type semiconductor by a built-in potential difference resulting from the p-n junction between the substrate 110 and the emitter region 121. Thus, when the substrate 110 is of the n-type and the emitter region 121 is of the p-type, the electrons and holes move to the substrate 110 and the emitter region 121, respectively.

Each of the plurality of back surface field regions 172 positioned at the back surface of the substrate 110 is a region that is more heavily doped than the substrate 110 with impurities of the same conductive type (for example, the n-type) as the substrate 110.

As described above, because the back surface field region 172 is more heavily doped than the substrate 110, the back surface field region 172 has a sheet resistance less than the substrate 110 and has conductivity greater than the substrate 110.

The plurality of back surface field regions 172 are not positioned at the entire back surface of the substrate 110 and are selectively or locally positioned only at the back surface of the substrate 110, on which the plurality of back electrodes 151 are positioned, or only at and around the back surface of the substrate 110, on which the plurality of back electrodes 151 are positioned. Thus, the back surface field regions 172 are not formed at the back surface of the substrate 110 between the adjacent back surface field regions 172 or between the adjacent back electrodes 151 and are separated from one another. The separated back surface field regions 172 have the same impurity doping concentration and the same sheet resistance. For example, each back surface field region 172 may have the sheet resistance of about 15 Ω/sq. to 45 Ω/sq.

Figure 4:
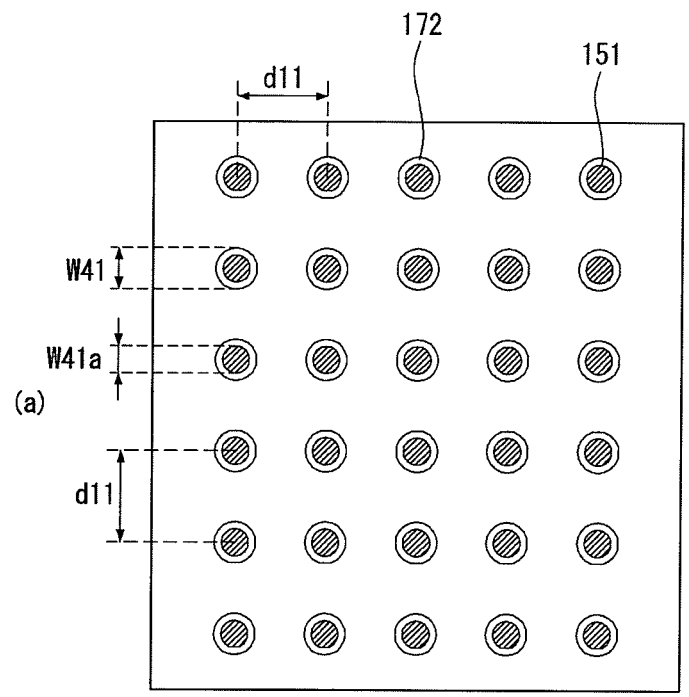
FIG. 4 schematically illustrates a back electrode positioned on a back surface of a solar cell according to an example embodiment of the invention.
Figure 4:
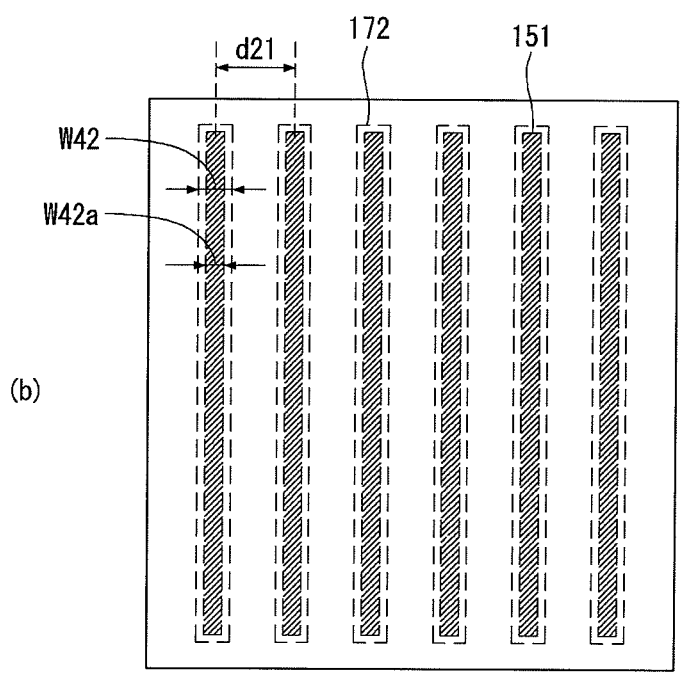

As shown in (a) of FIG. 4, each back surface field region 172 may have a circular dot shape (i.e., a circular island shape). Alternatively, as shown in (b) of FIG. 4, each back surface field region 172 may have a stripe shape extending in a fixed direction.

In another embodiment, each back surface field region 172 may have a polygonal dot shape of an oval, a rectangle, etc.

A potential barrier is formed by a difference between the impurity doping concentrations of the first conductive type region (for example, the n-type region) of the substrate 110 and the back surface field regions 172. Hence, the potential barrier prevents or reduces holes from moving to the back surface field regions 172 used as a moving path of electrons and makes it easier for electrons to move to the back surface field regions 172. Thus, the back surface field regions 172 reduce an amount of carriers lost by a recombination and/or a disappearance of the electrons and the holes at and around the back surface of the substrate 110 and accelerate a movement of desired carriers (for example, electrons), thereby increasing an amount of carriers moving to the back electrodes 151.

The passivation layer 192 positioned on the back surface of the substrate 110 may be formed of hydrogenated silicon nitride (SiNx:H) and may have a refractive index of about 2.0 to 2.2.

The passivation layer 192 performs a passivation function which converts a defect, for example, dangling bonds existing at and around the surface of the substrate 110 into stable bonds using hydrogen (H) contained in the passivation layer 192 to thereby prevent or reduce a recombination and/or a disappearance of carriers moving to the surface of the substrate 110. Thus, the passivation layer 192 reduces an amount of carriers lost by the defect.

In general, silicon nitride has the characteristic of positive fixed charges.

In the embodiment of the invention, the substrate 110 is of the n-type, and the passivation layer 192, which is formed directly on the back surface of the substrate 110 using silicon nitride, has the characteristic of positive fixed charges. Hence, negative charges (i.e., electrons) moving to the passivation layer 192 have a polarity opposite the passivation layer 192 formed of silicon nitride. As a result, the electrons are drawn to the passivation layer 192 because of the positive polarity of the passivation layer 192. On the other hand, positive charges (i.e., holes) have the same polarity as the passivation layer 192 formed of silicon nitride, and thus, are pushed to the front surface of the substrate 110 opposite the passivation layer 192 because of the positive polarity of the passivation layer 192. Hence, when the passivation layer 192 is formed on the back surface of the n-type substrate 110 using silicon nitride, an amount of electrons moving to the back surface of the substrate 110 further increases because of the influence of positive fixed charges. Further, the recombination of the electrons and the holes at and around the back surface of the substrate 110 is reduced.

The passivation layer 192 may have a thickness of about 70 nm to 80 nm, so as to obtain a surface passivation effect using hydrogen (H) and a field passivation effect using fixed charges.

As shown in FIGS. 1 to 3, the anti-reflection layer 130 includes a first anti-reflection layer 131 formed of aluminum oxide ($Al_2O_3$) and a second anti-reflection layer 132 which is formed on the first anti-reflection layer 131 using hydrogenated silicon nitride (SiNx:H). The second anti-reflection layer 132 is not positioned on the first anti-reflection layer 131 on the back surface of the substrate 110.

In the embodiment of the invention, the first anti-reflection layer 131 formed of aluminum oxide ($Al_2O_3$) may have a thickness of about 5 nm to 10 nm and a refractive index of about 1.1 to 1.6. The second anti-reflection layer 132 formed of hydrogenated silicon nitride (SiNx:H) may have a thickness of about 70 nm to 80 nm and a refractive index of about 2.0 to 2.2. In this instance, because the refractive index of the first anti-reflection layer 131 adjacent to the substrate 110 is less than the refractive index of the second anti-reflection layer 132 adjacent to an air, an anti-reflection effect is reduced by the refractive index of the first anti-reflection layer 131. It is preferable, but not required, that the thickness of the first anti-reflection layer 131 is much less than the thickness of the second anti-reflection layer 132, so as to prevent a reduction in the anti-reflection effect.

The first anti-reflection layer 131 formed of aluminum oxide ($Al_2O_3$) is positioned on the front surface of the substrate 110 (i.e., on the emitter region 121 positioned at the front surface of the substrate 110), on the back surface of the substrate 110 (i.e., on the passivation layer 192 positioned on the back surface of the substrate 110), and on the lateral surface of the substrate 110. In other words, the first anti-reflection layer 131 is positioned on the entire surface of the substrate 110, including the front surface, the lateral surface, and the back surface of the substrate 110, but excluding formation portions of the front electrode part 140 and the back electrodes 151.

In general, aluminum oxide ($Al_2O_3$) has the characteristic of negative fixed charges, which is opposite that of silicon nitride (SiNx).

Thus, positive fixed charges (i.e., holes) are drawn to the emitter region 121, and electrons moving to the emitter region 121 are pushed to the back surface of the substrate 110 by the first anti-reflection layer 131, which is positioned on the p-type emitter region 121 and is formed of aluminum oxide ($Al_2O_3$) having negative fixed charges.

Accordingly, an amount of electrons moving to the emitter region 121 further increases by the first anti-reflection layer 131 formed of aluminum oxide ($Al_2O_3$), and a recombination of electrons and holes at and around the emitter region 121 is reduced.

It is preferable, but not required, that the thickness of the passivation layer 192 is greater than the thickness of the first anti-reflection layer 131 positioned on the passivation layer 192, so that the first anti-reflection layer 131 having the negative fixed charges does not adversely affect the passivation layer 192 having the positive fixed charges. Thus, as described above, the passivation layer 192 may have the thickness of about 70 nm to 80 nm, and the first anti-reflection layer 131 may have the thickness of about 5 nm to 10 nm.

When the passivation layer 192 has the thickness of about 70 nm to 80 nm, the passivation layer 192 further improves the field passivation effect using fixed charges as well as the surface passivation effect.

Further, because the passivation function is performed by a passivation film formed of aluminum oxide, the emitter region 121 or the passivation layer 192 underlying the first anti-reflection layer 131 is protected.

The second anti-reflection layer 132 formed of hydrogenated silicon nitride (SiNx:H) is positioned only on the first anti-reflection layer 131 on the front surface of the substrate 110 and on the first anti-reflection layer 131 on the lateral surface of the substrate 110. Namely, the second anti-reflection layer 132 is not positioned on the back surface of the substrate 110, unlike the first anti-reflection layer 131.

Similar to the passivation layer 192 on the back surface of the substrate 110, hydrogen (H) contained in the second anti-reflection layer 132 moves to the first anti-reflection layer 131 to thereby perform the passivation function for converting a defect existing at and around the surface of the substrate 110 into stable bonds. Hence, the second anti-reflection layer 132 reduces an amount of carriers lost by the defect at and around the surface of the substrate 110.

As described above, because the double-layered anti-reflection layer 130 including the first anti-reflection layer 131 formed of aluminum oxide ($Al_2O_3$) and the second anti-reflection layer 132 formed of hydrogenated silicon nitride (SiNx:H) is formed on the front surface of the substrate 110, the field passivation effect using the fixed charges of the first anti-reflection layer 131 and the surface passivation effect using the second anti-reflection layer 132 are obtained.

When the thickness of the first anti-reflection layer 131 formed of aluminum oxide is equal to or greater than about 5 nm, the aluminum oxide layer 131 is more uniformly formed and the field passivation effect using the fixed charges of the first anti-reflection layer 131 is more stably obtained. When the thickness of the first anti-reflection layer 131 is equal to or less than about 10 nm, manufacturing time and cost of the first anti-reflection layer 131 are reduced without a reduction in the anti-reflection effect resulting from the refractive index of the first anti-reflection layer 131.

When the thickness of the second anti-reflection layer 132 formed of hydrogenated silicon nitride is equal to or greater than about 70 nm, the silicon nitride layer 132 is more uniformly formed and the surface passivation effect using hydrogen (H) is more stably obtained. When the thickness of the second anti-reflection layer 132 is equal to or less than about 80 nm, manufacturing time and cost of the second anti-reflection layer 132 are reduced.

The solar cell according to the embodiment of the invention has a double passivation structure including the passivation layer 192, which is formed directly on the back surface of the substrate 110 using hydrogenated silicon nitride (SiNx:H), and the first anti-reflection layer 131, which is formed on the passivation layer 192 using aluminum oxide ($Al_2O_3$). Thus, the passivation layer 192 serves as a lower layer (or a first passivation layer) of the double passivation structure on the back surface of the substrate 110, and the first anti-reflection layer 131 serves as an upper layer (or a second passivation layer) of the double passivation structure.

Hence, when heat is applied to the solar cell during a manufacturing process thereof, hydrogen (H) contained in the passivation layer 192 moves toward not the first anti-reflection layer 131 but the back surface of the substrate 110. As a result, the passivation effect of the back surface of the substrate 110 using hydrogen (H) contained in the passivation layer 192 is further improved.

The front electrode part 140 is connected to the emitter region 121 and includes a plurality of front electrodes (or first electrodes) 141 and a plurality of front bus bars (first bus bars) 142 connected to the plurality of front electrodes 141.

The front electrodes 141 are electrically and physically connected to the second emitter region 1212 of the emitter region 121. The front electrodes 141 are separated from one another and extend parallel to one another in a fixed direction. The front electrodes 141 collect carriers (for example, holes) moving to the emitter region 121.

The front bus bars 142 are electrically and physically connected to the second emitter region 1212 of the emitter region 121 and extend in a direction crossing the front electrodes 141.

The front bus bars 142 have to collect not only carriers (for example, holes) moving from the emitter region 121 but also carriers collected by the front electrodes 141 crossing the front bus bars 142 and have to move the collected carriers in a desired direction. Thus, a width of each front bus bar 142 may be greater than a width of each front electrode 141.

In the embodiment of the invention, the front bus bars 142 are positioned on the same level layer as the front electrodes 141 and are electrically and physically connected to the front electrodes 141 at crossings of the front electrodes 141 and the front bus bars 142.

Accordingly, as shown in FIG. 1, the plurality of front electrodes 141 have a stripe shape extending in a transverse (or longitudinal) direction, and the plurality of front bus bars 142 have a stripe shape extending in a longitudinal (or transverse) direction. Hence, the front electrode part 140 has a lattice shape on the front surface of the substrate 110.

In the embodiment of the invention, a width W1 of each front electrode 141 may be about 20 μm to 30 μm, and a width W2 of each front bus bar 142 may be about 1.5 mm to 2 mm.

As described above, the emitter region 121 according to the embodiment of the invention has a selective emitter structure having different impurity doping concentrations depending on whether the front electrode part 140 is present or absent. Namely, the emitter region 121 according to the embodiment of the invention has the selective emitter structure including the first and second emitter regions 1211 and 1212 each having the different impurity doping thickness depending on the formation of the front electrode part 140.

Accordingly, a vertical distance L1 between the back surface of the substrate 110 and the p-n junction surface at the second emitter region 1212, at which the front electrode part 140 is present, is reduced, as compared to a general emitter region having a uniform impurity doping concentration and a uniform impurity doping thickness irrespective of the presence of the front electrode part 140. Hence, a moving distance of holes moving to the second emitter region 1212 connected to the front electrode part 140 is reduced. As a result, a carrier collection efficiency of the front electrode part 140 is improved, and the efficiency of the solar cell is improved. In particular, in the embodiment of the invention, because holes having the mobility less than that of electrons move from the substrate 110 to the emitter region 121, an amount of holes moving to the second emitter region 1212 of the emitter region 121 increases. As a result, the efficiency of the solar cell is improved.

The first emitter region 1211 mainly performs the movement of carriers to the front electrode part 140 and has the impurity doping concentration lower than the second emitter region 1212. Thus, a loss amount of carries resulting from impurities of the first emitter region 1211 is reduced, and an amount of carriers moving from the first emitter region 1211 to the front electrode part 140 increases. Further, the second emitter region 1212, which directly contacts the front electrode part 140 and outputs carriers, has the conductivity greater than the first emitter region 1211 and the resistance less than the first emitter region 1211 due to the high impurity doping concentration of the second emitter region 1212. Thus, the carrier transfer efficiency of the front electrodes 141 at the second emitter region 1212 is improved. As a result, the efficiency of the solar cell is improved.

The front bus bars 142 are connected to an external device and output the collected carriers to the external device.

The front electrode part 140 including the front electrodes 141 and the front bus bars 142 is formed of at least one conductive material, for example, silver (Ag).

In the embodiment of the invention, the number of front electrodes 141 and the number of front bus bars 142 may vary, if desired or necessary.

The plurality of back electrodes 151 are positioned on the plurality of back surface field regions 172 and contact the plurality of back surface field regions 172.

As shown in (a) and (b) of FIG. 4, the back electrodes 151 have the same shape as the back surface field regions 172.

Accordingly, as shown in (a) of FIG. 4, when each back surface field region 172 has a dot shape such as a circle, an oval, and a polygon, each back electrode 151 has the same shape (i.e., the dot shape) as the back surface field region 172 because the back electrodes 151 are respectively connected to the back surface field regions 172. Further, as shown in (b) of FIG. 4, when each back surface field region 172 has the stripe shape, each back electrode 151 has the stripe shape extending along the back surface field region 172 on the back surface field region 172.

Because the back electrode 151 is positioned inside the formation area of the back surface field region 172, a width W41a (or W42a) of the back electrode 151 is equal to or less than a width W41 (or W42) of the back surface field region 172.

A formation area of the back surface field region 172 having the dot shape is less than a formation area of the back surface field region 172 having the stripe shape. Thus, a collection efficiency of the back electrodes 151 collecting carriers moving to the back surface of the substrate 110 at the back surface field regions 172 having the dot shape is reduced.

Accordingly, it is preferable, but not required, that a distance (or a pitch) d11 between centers of the two adjacent back surface field regions 172 each having the dot shape is less than a distance (or a pitch) d21 between centers of the two adjacent back surface field regions 172 each having the stripe shape, so as to improve the carrier collection efficiency of the back electrodes 151 on the back surface field regions 172 having the dot shape.

For example, the pitch d11 between the centers of the two adjacent back surface field regions 172 each having the dot shape may be about 0.03 mm to 0.11 mm, and the pitch d21 between the centers of the two adjacent back surface field regions 172 each having the stripe shape may be about 0.1 mm to 0.6 mm. The diameter W41 (or the maximum width W42) of each back surface field region 172 may be about 10 µm to 30 µm. In the embodiment of the invention, the pitch between the two adjacent back surface field regions 172 is substantially equal to a pitch between the two adjacent back electrodes 151 positioned on the two adjacent back surface field regions 172.

When the pitch d11 (d21) between the back surface field regions 172 is equal to or greater than about 0.03 mm (or about 0.1 mm), an amount of carriers lost by impurities contained in the back surface field regions 172 may further decrease, and an amount of carriers moving to the back surface field regions 172 may further increase. When the pitch d11 (d21) between the back surface field regions 172 is equal to or less than about 0.11 mm (or about 0.6 mm), an amount of carriers moving to the back surface field regions 172 may increase by a reduction in a moving distance of carriers.

As described above, because the back surface field regions 172 are selectively or locally positioned at the back surface of the substrate 110, a non-formation portion of the back surface field regions 172 exists between the back electrodes 151 at the backside of the substrate 110.

However, when the back surface field regions 172 are positioned at the entire back surface of the substrate 110 or at the entire back surface of the substrate 110 except edges, carriers may be lost by the back surface field regions 172 more heavily doped than the substrate 110.

On the other hand, in the embodiment of the invention, because the back surface field regions 172 are selectively or locally positioned at the back surface of the substrate 110, a contact resistance between the back electrodes 151 and the back surface field regions 172 decreases and the conductivity of the back surface field regions 172 contacting the back electrodes 151 increases. Hence, a loss of carriers by impurities of the back surface field region existing at a non-formation portion of the back electrodes 151 is reduced or prevented. As a result, because an amount of carriers lost by the back surface field regions 172 decreases, an amount of carriers collected by the front electrode part 140 and the back electrodes 151 increases, and the efficiency of the solar cell is improved.

The plurality of back electrodes 151 may contain the same conductive material, for example, silver (Ag) as the front electrode part 140. Alternatively, the plurality of back electrodes 151 may contain a different conductive material from that of the front electrode part 140. In this instance, the plurality of back electrodes 151 may contain aluminum (Al).

The solar cell having the above-described structure may further include a plurality of back bus bars (or second bus bars) which are positioned on the back surface of the substrate 110 to be opposite to the front bus bars 142 and are connected to the back electrodes 151. Thus, the back bus bars may cross the back electrodes 151 and may be connected to the back electrodes 151 in the same manner as the front bus bars 142.

The back bus bars may be positioned on the first anti-reflection layer 131 positioned on the back surface of the substrate 110. Alternatively, the back bus bars may pass through the first anti-reflection layer 131 and the passivation layer 192, and may directly contact the back surface of the substrate 110 in the same manner as the back electrodes 151.

If the back bus bars directly contact the back surface of the substrate 110, the back surface field regions 172 may be formed at the back surface of the substrate 110 contacting the back bus bars. In this instance, because the back surface field regions 172 contacting the back electrodes 151 cross the back surface field regions 172 contacting the back bus bars at each of crossings of the back electrodes 151 and the back bus bars, one back surface field region 172 is formed at each crossing.

The solar cell shown in FIGS. 1 and 2 is a bifacial solar cell, in which light is incident on both the front surface and the back surface of the substrate 110.

In the embodiment of the invention, the back surface of the substrate 110 has not a textured surface corresponding to an uneven surface formed by a separate texturing process but a substantially flat surface. A back passivation part including the passivation layer 192 and the first anti-reflection layer 131 is positioned on the flat back surface of the substrate 110.

Accordingly, an amount of light passing through the flat back surface of the substrate 110 further decreases than the textured back surface of the substrate 110 formed of single crystal silicon which has pyramid-shaped uneven portions by the separate texturing process. As a result, a voltage (Voc) output from the solar cell increases.

In addition, the solar cell according to the embodiment of the invention is manufactured based on the substrate 110 formed of single crystal silicon. Therefore, the solar cell including the substrate 110 formed of single crystal silicon has better efficiency than a solar cell including a substrate formed of polycrystalline silicon.

An operation of the solar cell having the above-described structure is described below.

When light irradiated onto at least one of the front surface and the back surface of the solar cell is incident on the emitter region 121 and the substrate 110 which are semiconductor parts, electron-hole pairs are generated in the semiconductor parts by light energy produced based on the incident light. In this instance, because a reflection loss of the light incident on the substrate 110 is reduced by the textured surface of the substrate 110 and the second and first anti-reflection layers 132 and 131, an amount of light incident on the substrate 110 increases.

The electrons move to the n-type substrate 110 and the holes move to the p-type emitter region 121 by the p-n junction of the substrate 110 and the emitter region 121. The holes moving to the emitter region 121 are collected by the front electrodes 141 and the front bus bars 142 and then move along the front bus bars 142. The electrons moving to the substrate 110 are collected by the back electrodes 151. When the front bus bars 142 are connected to the back electrodes 151 or the back bus bars using electric wires, current flows therein to thereby enable use of the current for electric power.

In the embodiment of the invention, impurity doping concentrations of the emitter region (i.e., the second emitter region 1212) connected to the front electrode part 140 and the back surface field regions 172 connected to the back electrodes 151 are higher than impurity doping concentrations of other emitter region (i.e., the first emitter region 1211) and the substrate 110. Therefore, the conductivity of the second emitter region 1212 and the back surface field regions 172 abutting on the front electrode part 140 and the back electrodes 151 increases. Hence, a transfer amount of carriers moving to the front electrode part 140 and the back electrodes 151 increases.

Further, because the impurity doping concentration of the substrate 110 between the first emitter region 1211 and the back surface field region 172 is lower than the impurity doping concentration of the substrate 110 between the second emitter region 1212 and the back surface field region 172, a loss amount of carriers resulting from impurities decreases.

In addition, the back surface of the substrate 110 is the flat surface, light (for example, light of a long wavelength) which is incident from the front surface of the substrate 110 and reaches the back surface of the substrate 110, is reflected from the inside of the flat back surface of the substrate 110. Hence, a loss amount of light decreases.

The efficiency of the solar cell is described below with reference to FIG. 5.

Figure 5:
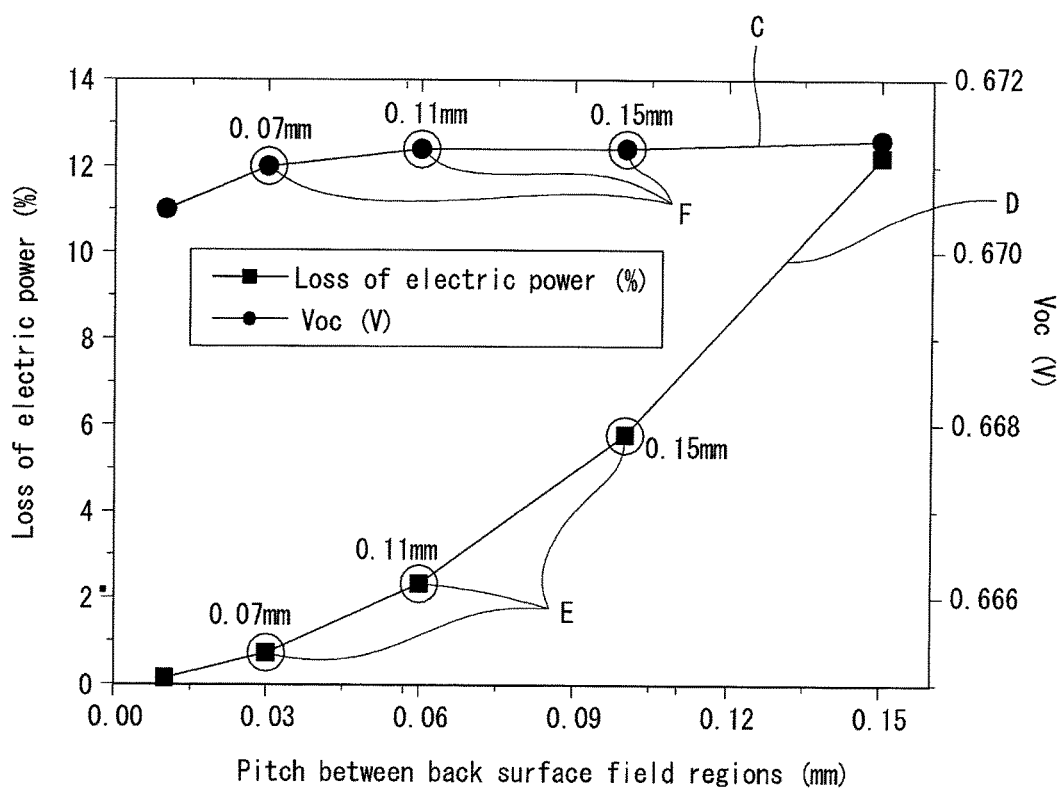
FIG. 5 is a graph illustrating a loss amount of electric power depending on a distance between adjacent back surface field regions and changes in an open-circuit voltage depending on a distance between back electrodes in a solar cell according to an example embodiment of the invention.

FIG. 5 illustrates a loss of electric power and an open-circuit voltage Voc depending on a pitch (or a pitch between the back electrodes 151) between the back surface field regions 172 when each back surface field region 172 has a dot shape (E and F). Further, FIG. 5 illustrates a loss of electric power and an open-circuit voltage Voc depending on a pitch between the back surface field regions 172 when each back surface field region 172 has a stripe shape (C and D).

As shown in FIG. 5, as the pitch between the back surface field regions 172 increases regardless of whether each back surface field region 172 has the dot shape (E) or the stripe shape (D), a loss amount of electric power of the solar cell increases.

For example, as shown in FIG. 5, when the pitch between the back surface field regions 172 each having the stripe shape was about 0.01 cm (or 0.1 mm), the loss amount of electric power was about 0%, (D) and the open-circuit voltage Voc was about 0.6705 V (C). When the pitch between the back surface field regions 172 each having the stripe shape was about 0.06 cm (or 0.6 mm), the loss amount of electric power was about 2% (D), and the open-circuit voltage Voc was about 0.6712 V (C). In other words, as the pitch between the back surface field regions 172 increased, the loss amount of electric power and the open-circuit voltage increased. Thus, it is preferable, but not required, that the pitch (or the pitch between the back electrodes 151) between the back surface field regions 172 is about 0.1 mm to 0.6 mm in consideration of an increase in the loss amount of electric power and the open-circuit voltage resulting from an increase in the pitch between the back surface field regions 172 each having the stripe shape (C and D).

Further, as shown in FIG. 5, when the pitch between the back surface field regions 172 each having the dot shape was about 70 μm (or 0.07 mm), the loss amount of electric power was about 1% (E), and the open-circuit voltage Voc was about 0.671 V (F). When the pitch between the back surface field regions 172 each having the dot shape was about 110 μm (or 0.11 mm), the loss amount of electric power was about 2.5% (E), and the open-circuit voltage Voc was about 0.6715 V (F). When the pitch between the back surface field regions 172 each having the dot shape was about 150 μm (or 0.15 mm), the loss amount of electric power was about 6% (E), and the open-circuit voltage Voc was about 0.6715 V (F). In other words, as the pitch between the back surface field regions 172 increased, the open-circuit voltage Voc increased, but an increase rate of the open-circuit voltage Voc was much less than an increase rate of the loss amount of electric power. Thus, it is preferable, but not required, that the pitch (or the pitch between the back electrodes 151) between the back surface field regions 172 each having the dot shape (E and F) is about 0.03 mm to 0.11 mm.

Figure 6:
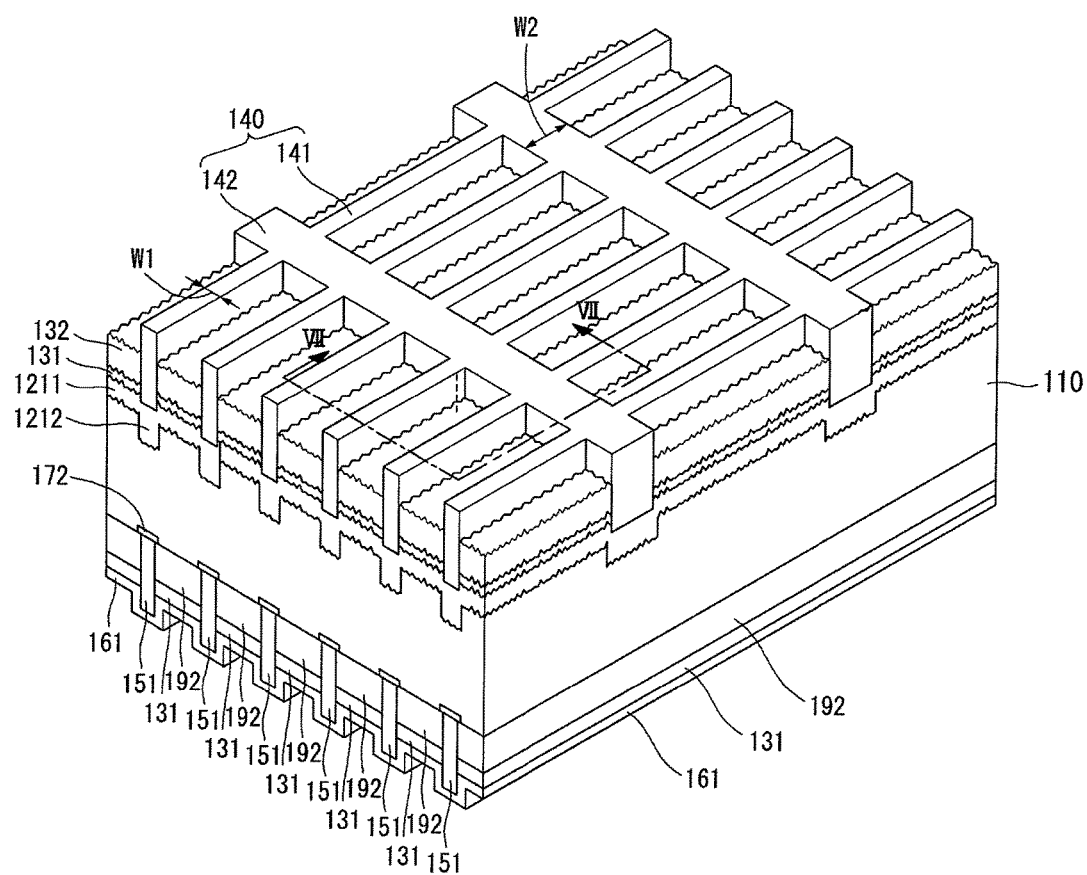
FIG. 6 is a partial perspective view of another example of a solar cell according to an example embodiment of the invention.
Figure 7:
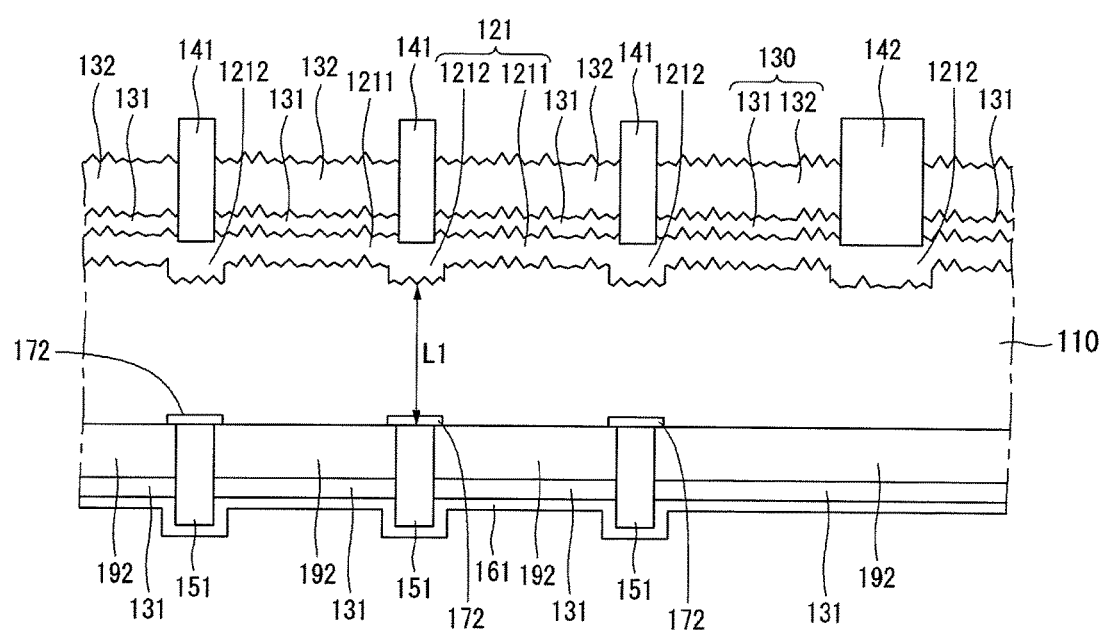
FIG. 7 is a cross-sectional view taken along line VII-VII of FIG. 6.

The above-described solar cell shown in FIGS. 1 to 3 may have a structure illustrated in FIGS. 6 and 7.

Configuration of a solar cell shown in FIGS. 6 and 7 is substantially the same as the solar cell shown in FIGS. 1 to 3, except that the solar cell shown in FIGS. 6 and 7 further includes a back reflection layer 161 on a back surface of a substrate 110. In this instance, the solar cell shown in FIGS. 6 and 7 may receive light only through a front surface of the substrate 110, on which the back reflection layer 161 is not positioned.

Structures and components identical or equivalent to those described in the solar cell shown in FIGS. 1 to 3 are designated with the same reference numerals in the solar cell shown in FIGS. 6 and 7, and a further description may be briefly made or may be entirely omitted.

As shown in FIG. 6, the back reflection layer 161 is positioned on back electrodes 151 and on a first anti-reflection layer 131, positioned on the back surface of the substrate 110, on which the back electrodes 151 are not positioned. Thus, the back reflection layer 161 is positioned on the entire back surface of the substrate 110. If necessary or desired, the back reflection layer 161 may be not positioned at an edge of the back surface of the substrate 110.

The back reflection layer 161 may have a thickness of about 1,000 Å to 3,000 Å and may be formed of a metal material such as aluminum (Al), silver (Ag), an alloy (Al:Ag) of aluminum (Al) and silver (Ag), an Al alloy and copper (Cu).

A density of the back reflection layer 161 may be larger than a density of a back electrode.

The back reflection layer 161 serves as a reflector for reflecting light passing through the substrate 110 to the inside of the substrate 110.

When the back electrodes 151 are generally formed on the back surface of the substrate 110 through a screen printing method using an Al paste containing Al, or back bus bars are generally formed on the back surface of the substrate 110 through the screen printing method using an Ag paste containing Ag, each back electrode 151 or each back bus bar has many holes or grooves. Hence, a density of the back electrode 151 or a density of the back bus bar is greatly reduced.

As described above, when the back electrodes 151 or the back bus bars are formed on the back surface of the substrate 110 using the screen printing method, the density of the back electrode 151 or the density of the back bus bar is much less than a density of a metal layer, i.e., the back reflection layer 161 formed using a sputtering method or an evaporation method, even if the back electrode 151 or the back bus bar contains the metal material such as Al or Ag. Hence, a specific surface area of the back electrode 151 or the back bus bar formed using the screen printing method is much greater than a specific surface area of the back reflection layer 161 formed using the sputtering method or the evaporation method.

A reflectance of the back reflection layer 161 is greater than a reflectance of a metal layer (for example, the back electrodes 151 or the back bus bars) formed using the screen printing method because of a difference between the densities.

Accordingly, in the embodiment of the invention, light passing through the substrate 110, the passivation layer 192, and the first anti-reflection layer 131 is again incident on the substrate 110 by the back reflection layer 161. Hence, the efficiency of the solar cell is improved.

Because the back reflection layer 161 is formed of the metal material, the back reflection layer 161 has good conductivity. Further, because the back reflection layer 161 is positioned on the first anti-reflection layer 131 (positioned on the back surface of the substrate 110) constituting a back passivation layer and on the back electrodes 151, the back reflection layer 161 is electrically connected to the back electrodes 151.

Thus, carriers collected by the back electrodes 151 move to the back reflection layer 161.

Because a conductive tape, for example, a ribbon connected to an external device is positioned on the back reflection layer 161, carriers collected by the back electrodes 151 are output to the external device through the back reflection layer 161.

Thus, the solar cell according to the embodiment of the invention need not include the plurality of back bus bars which are connected to the back electrodes 151 and are connected to the external device through the conductive tape. As a result, the manufacturing cost and time of the solar cell are saved.

Figure 8:
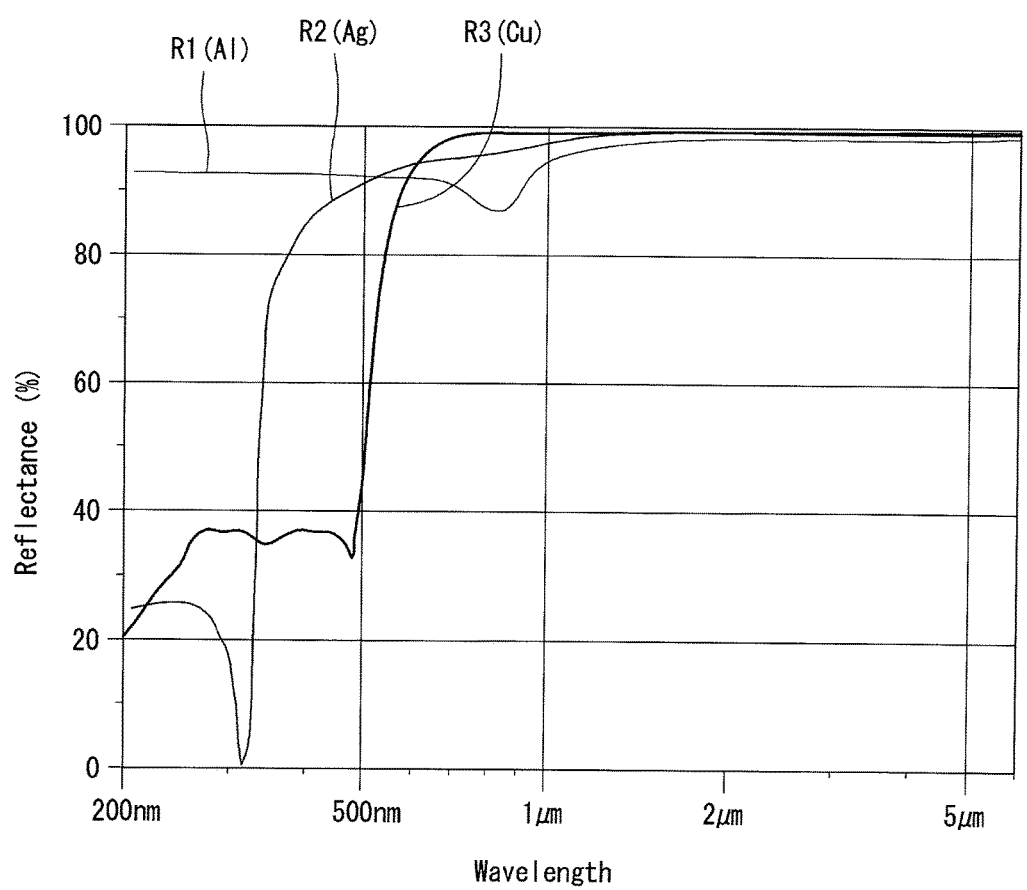
FIG. 8 is a graph illustrating a reflectance of light at each wavelength of light depending on a material of a back reflection layer according to an example embodiment of the invention.

FIG. 8 illustrates a reflectance of light depending on a material of the back reflection layer 161 when the solar cell includes the back reflection layer 161.

As shown in FIG. 8, a reflectance graph R1 of light based on the back reflection layer 161 formed of aluminum (Al) indicated that the reflectance was uniform and good over the entire wavelength (for example, about 200 nm to 5 μm) of light.

Further, a reflectance graph R2 of light based on the back reflection layer 161 formed of silver (Ag) indicated that the reflectance was good at the wavelength equal to or greater than about 350 nm. A reflectance graph R3 of light based on the back reflection layer 161 formed of copper (Cu) indicated that the reflectance was good at the wavelength equal to or greater than about 500 nm.

Accordingly, as indicated by the reflectance graphs R1 to R3 shown in FIG. 8, it is preferable, but not required, that the back reflection layer 161 is formed of aluminum (Al) in consideration of the manufacturing cost and the effect of the back reflection layer 161.

Figure 9:
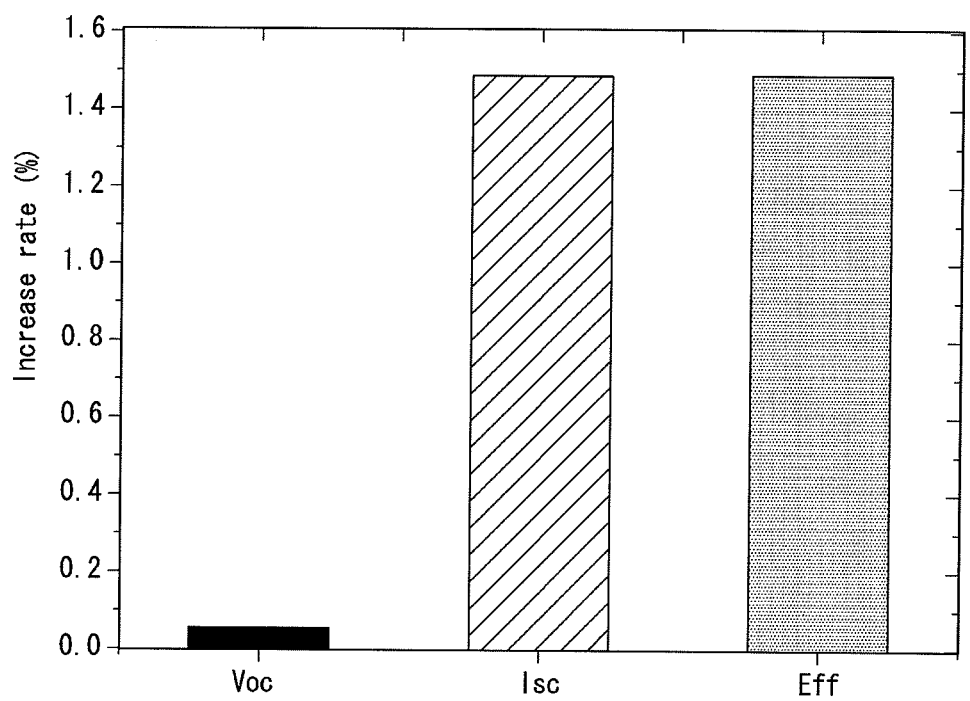
FIG. 9 is a graph illustrating an increase rate of each of an open-circuit voltage, a short circuit current, and an efficiency in a solar cell according to an example embodiment of the invention.

FIG. 9 illustrates an increase rate of each of parameters of the solar cell when the back reflection layer 161 is formed on the back surface of the substrate 110. More specifically, FIG. 9 is a graph illustrating an increase rate of each parameter of the solar cell, as compared to an ideal solar cell in which electric power is not lost by a resistance.

As shown in FIG. 9, an increase rate of the open-circuit voltage Voc of the solar cell including the back reflection layer 161 was about 0.05%, and also increase rates of the short circuit current Isc and the efficiency Eff of the solar cell including the back reflection layer 161 were about 1.5%. In other words, because an amount of light, which passes through the substrate 110 and then is again incident on the substrate 110, greatly increases by a reflection operation of the back reflection layer 161, the short circuit current Isc and the efficiency Eff of the solar cell are greatly improved.

FIGS. 10A to 10K sequentially illustrate a method for manufacturing a solar cell according to an example embodiment of the invention.

Figure 10A:
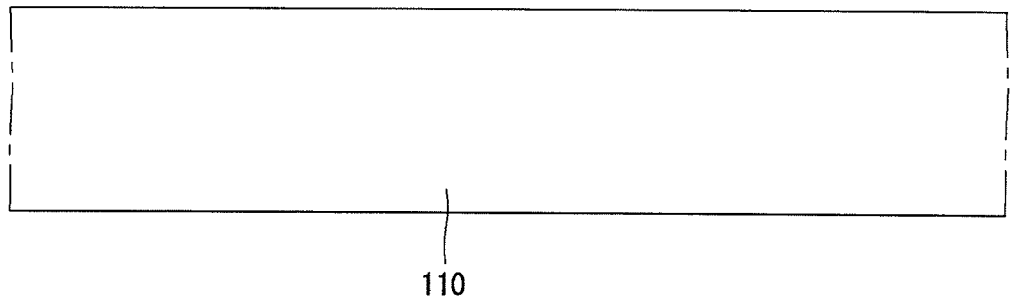
FIGS. 10A to 10K sequentially illustrate a method for manufacturing a solar cell according to an example embodiment of the invention.
Figure 10B:
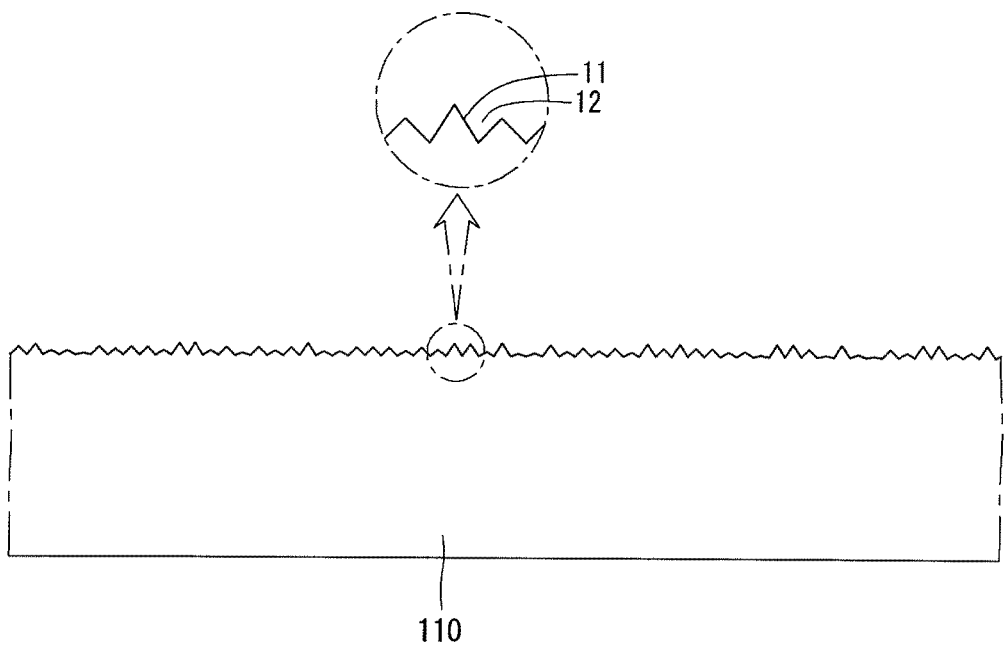

As shown in FIGS. 10A and 10B, a texturing process is performed on a flat front surface of a semiconductor substrate 110 of a first conductive type (for example, n-type), which is formed of, for example, single crystal silicon, to form a textured surface corresponding to an uneven surface having a plurality of protrusions 11 and a plurality of depressions 12 or having uneven characteristics. In this instance, the flat front surface of the substrate 110 formed of single crystal silicon is etched using an alkali solution to form the textured surface having the plurality of pyramid-shaped protrusions 11.

After an etch stop layer is formed on a back surface of the substrate 110, the substrate 110 may be etched. Alternatively, only the front surface of the substrate 110 may be etched by immersing only the front surface of the substrate 110 in an etchant. Alternatively, both the front surface and the back surface of the substrate 110 may have the textured surface by etching both the front surface and the back surface of the substrate 110. Then, the back surface of the substrate 110 may be made flat by removing the textured surface from the back surface of the substrate 110.

Figure 10C:
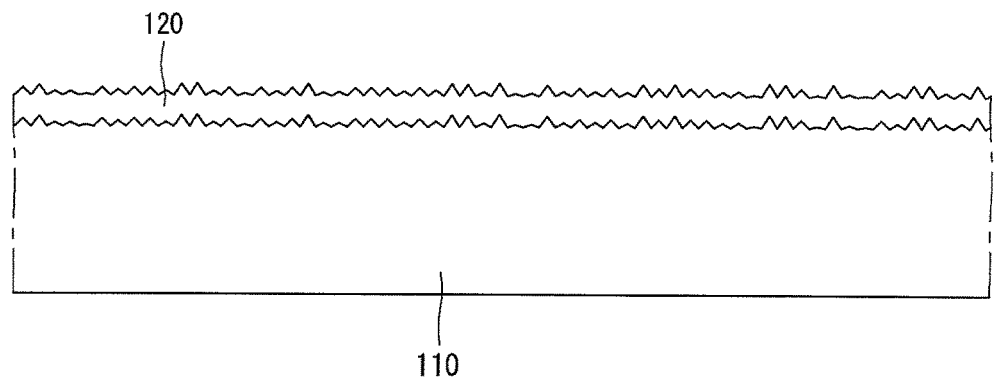

Next, as shown in FIG. 10C, impurities of a group III element (for example, boron (B)) are injected into the front surface of the substrate 110 using a thermal diffusion method or an ion implantation method to form an emitter layer 120 at the front surface of the substrate 110. The emitter layer 120 may have an impurity doping thickness of about 200 nm to 500 nm and a sheet resistance of about 80 Ω/sq. to 150 Ω/sq.

Figure 10D:
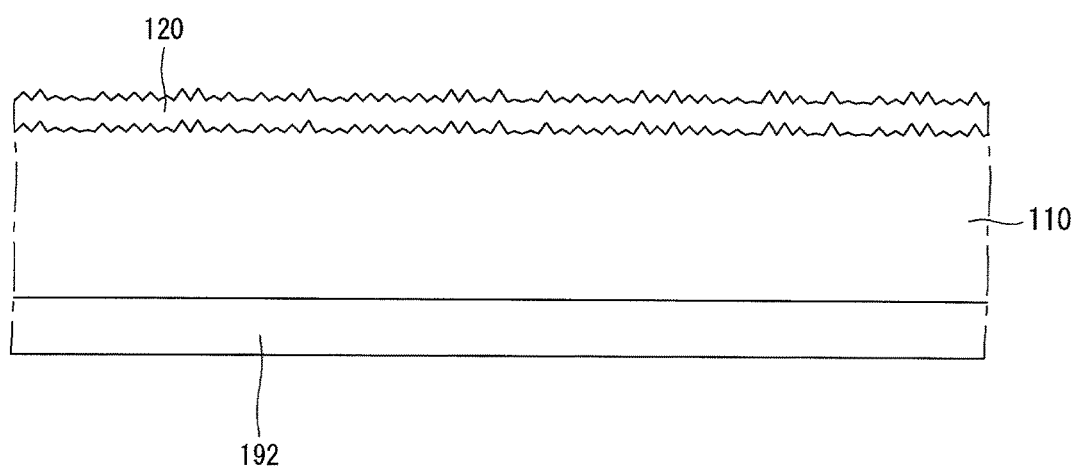

Next, as shown in FIG. 10D, a passivation layer 192 formed of silicon nitride (SiNx) is formed on the flat back surface of the substrate 110. The passivation layer 192 may be formed using a deposition method such as a plasma enhanced chemical vapor deposition (PECVD) method. The passivation layer 192 may have a thickness of about 70 nm to 80 nm.

Figure 10E:
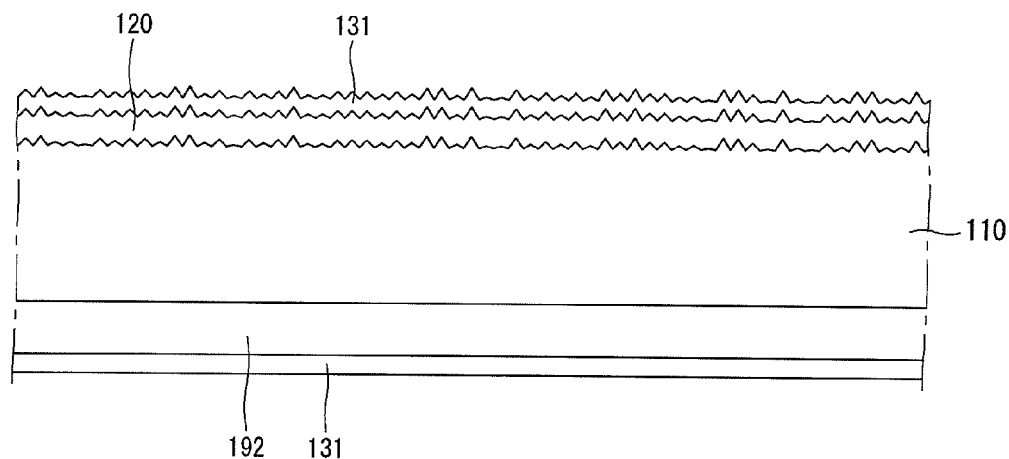

Next, as shown in FIG. 10E, a first anti-reflection layer 131 formed of aluminum oxide (Al$_2$O$_3$) is formed on the front surface, the back surface, and a lateral surface of the substrate 110. FIG. 10E shows the first anti-reflection layer 131 positioned only on the front surface and the back surface of the substrate 110. However, as shown in FIG. 3, the first anti-reflection layer 131 is substantially positioned on the lateral surface of the substrate 110 as well as the front surface and the back surface of the substrate 110.

Accordingly, the first anti-reflection layer 131 formed on the back surface of the substrate 110 is positioned on the passivation layer 192, and the first anti-reflection layer 131 formed on the front surface of the substrate 110 is positioned on the emitter layer 120. Further, the first anti-reflection layer 131 formed on the lateral surface of the substrate 110 is positioned directly on the lateral surface of the substrate 110.

The desired surfaces of the substrate 110 to form the first anti-reflection layer 131 are sequentially exposed to a process gas using the deposition method such as the PECVD method to thereby form the first anti-reflection layer 131 on the front surface, the back surface, and the lateral surface of the substrate 110.

The first anti-reflection layer 131 is formed on the front surface, the back surface, and the lateral surface of the substrate 110 under the same process conditions. Therefore, the first anti-reflection layer 131 on the emitter layer 120 at the front surface of the substrate 110, the first anti-reflection layer 131 on the passivation layer 192 on the back surface of the substrate 110, and the first anti-reflection layer 131 directly on the lateral surface of the substrate 110 have the same characteristics, for example, material, thickness, refractive index, composition, etc. In other words, the first anti-reflection layers 131 positioned on the front surface, the back surface, and the lateral surface of the substrate 110 are the same layer.

A deposition process may be once performed using an atomic layer deposition (ALD) method, etc., to form the first anti-reflection layer 131 on the front surface, the back surface, and the lateral surface of the substrate 110. In this instance, manufacturing time of the first anti-reflection layer 131 is greatly reduced as compared to the individual formation of the first anti-reflection layers 131 on the front surface, the back surface, and the lateral surface of the substrate 110. Further, the first anti-reflection layers 131 formed on the front surface, the back surface, and the lateral surface of the substrate 110 through the one deposition process are the same layer having the same characteristics.

In the embodiment of the invention, the first anti-reflection layer 131 may have a thickness of about 5 nm to 10 nm.

Figure 10F:
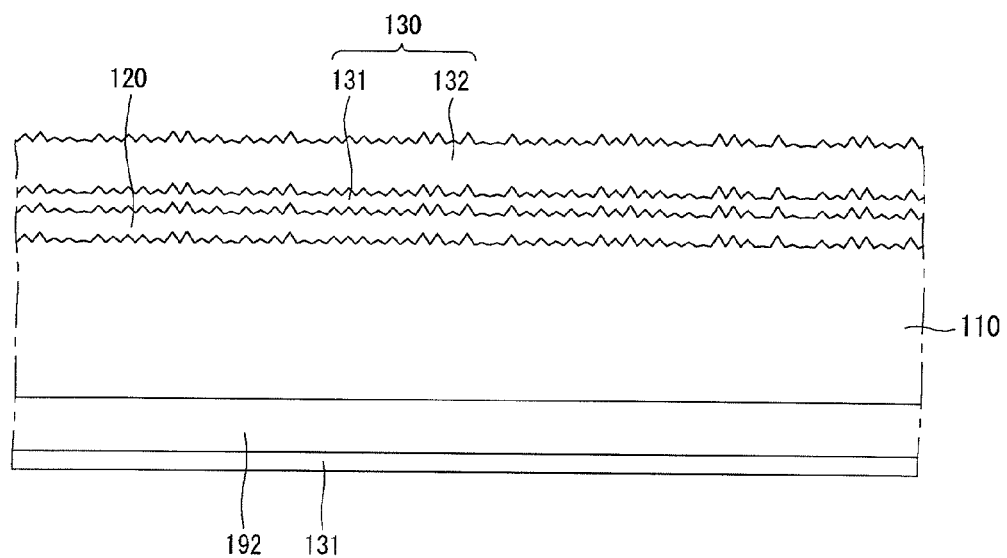

Next, as shown in FIG. 10F, a second anti-reflection layer 132 formed of silicon nitride (SiNx) is formed on the front surface of the substrate 110 (i.e., on the first anti-reflection layer 131 on the front surface of the substrate 110) and on the lateral surface of the substrate 110 (i.e., on the first anti-reflection layer 131 on the lateral surface of the substrate 110).

The second anti-reflection layer 132 may be formed using the deposition method such as the PECVD method and may have a thickness of about 70 nm to 80 nm.

As a result, a double-layered anti-reflection layer 130 including the first anti-reflection layer 131 (serving as a lower layer) formed of aluminum oxide (Al$_2$O$_3$) and the second anti-reflection layer 132 (serving as an upper layer) formed of silicon nitride (SiNx) is formed on the front surface of the substrate 110. Further, a double-layered passivation structure including a first passivation layer (i.e., the passivation layer 192) serving as a lower layer formed of silicon nitride (SiNx) and a second passivation layer (i.e., the first anti-reflection layer 131) serving as an upper layer formed of aluminum oxide (Al$_2$O$_3$) is formed on the back surface of the substrate 110.

Figure 10G:
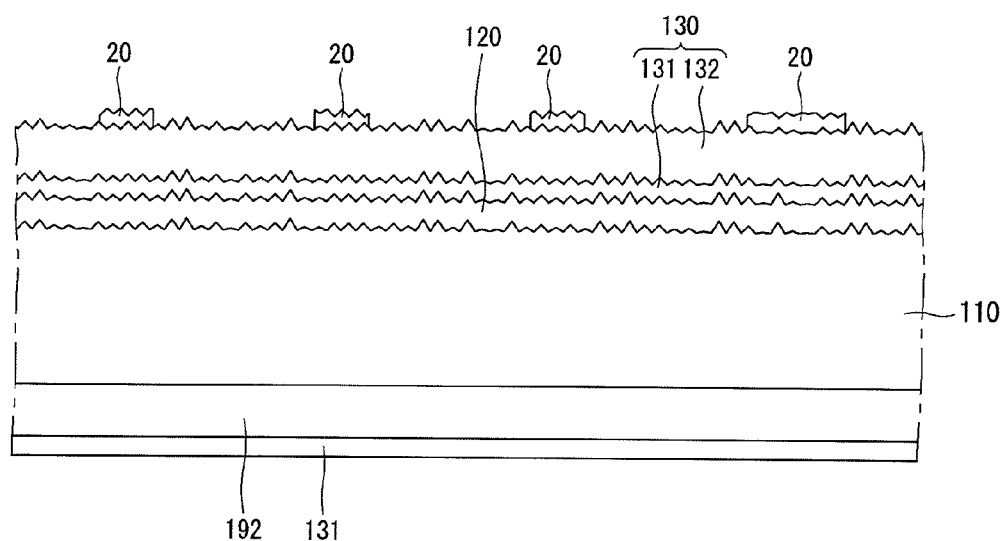

Next, as shown in FIG. 10G, impurities of the same conductive type (i.e., a second conductive type) as the emitter layer 120 are selectively or locally doped on the second anti-reflection layer 132 to form an impurity region (or layer) 20. The impurity region 20 may be formed by selectively or locally coating an impurity solution on the emitter layer 120 using an ink jet method and then drying the impurity solution. Alternatively, the impurity region 20 may be formed by selectively or locally coating an impurity paste on the emitter layer 120 using the screen printing method and then drying the impurity paste.

Figure 10H:
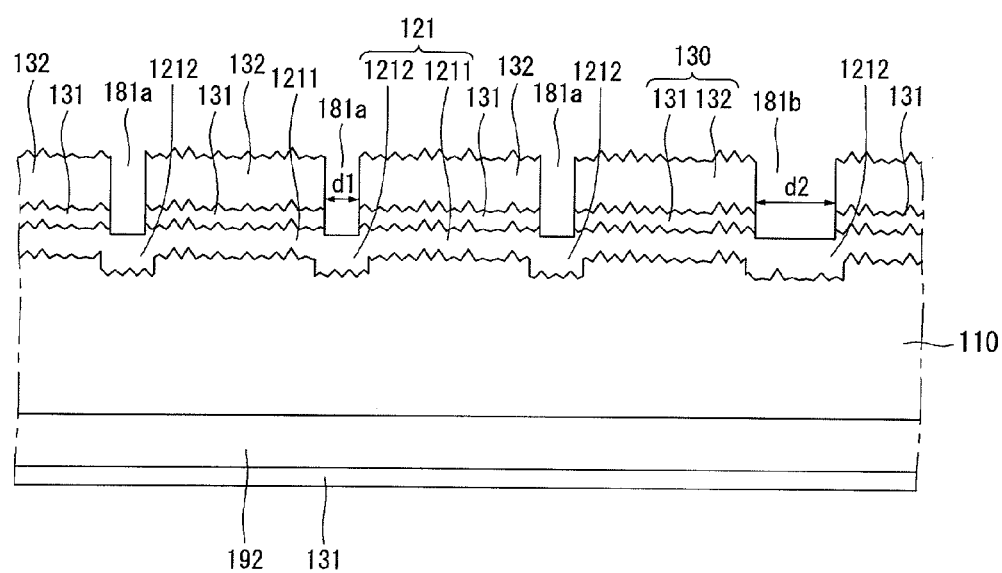

Next, as shown in FIG. 10H, a laser beam is irradiated onto the impurity region 20, and a region of the substrate 110 underlying the impurity region 20, onto which the laser beam is irradiated, is additionally doped with p-type impurities. Hence, a plurality of openings (or first openings) 181*a* and 181*b*, which partially pass through the second and first anti-reflection layers 132 and 131 underlying the impurity region 20 and expose a portion of the emitter layer 120, are formed in the second and first anti-reflection layers 132 and 131.

Accordingly, a region of the emitter layer 120, onto which the laser beam is not irradiated, is a first emitter region 1211, and a region of the emitter layer 120, onto which the laser beam is irradiated, is a second emitter region 1212. Hence, an emitter region 121 of a selective emitter structure including the first and second emitter regions 1211 and 1212 is formed. The first emitter region 1211 has the same impurity doping thickness, impurity doping concentration, and sheet resistance as the emitter layer 120. The second emitter region 1212 has an impurity doping thickness and an impurity doping concentration greater than the first emitter region 1211 and has a sheet resistance less than the first emitter region 1211.

Further, the portion of the emitter layer 120 exposed by the plurality of openings 181*a* and 181*b* is the second emitter region 1212.

As described above, because the second emitter region 1212 is formed in the impurity region 20, onto which the laser beam is irradiated, the impurity region 20 is positioned at a location to form the second emitter region 1212. Further, the second emitter region 1212 is positioned at a location corresponding to a formation location of a plurality of front electrodes 141 and a plurality of front bus bars 142 formed in a subsequent process.

Accordingly, an impurity doping thickness of the first emitter region 1211 may be about 200 nm to 500 nm, and an impurity doping thickness of the second emitter region 1212 may be about 400 nm to 700 nm. In the embodiment of the invention, it is considered that the impurity doping thicknesses existing within the margin of error obtained by the protrusions 11 of the textured front surface of the substrate 110 are substantially equal to one another.

As described above, because the plurality of openings 181a and 181b are formed in a portion onto which the laser beam is irradiated, the openings 181a and 181b are formed on the second emitter region 1212 of the emitter region 121 along the second emitter region 1212. Thus, the second emitter region 1212 is exposed through the openings 181a and 181b.

The plurality of openings 181a and 181b include a plurality of openings 181a for the front electrodes 141 and a plurality of openings 181b for the front bus bars 142. A width d1 of each of the openings 181a for the front electrodes 141 is less than a width d2 of each of the openings 181b for the front bus bars 142.

The openings 181a are separated from one another and have a stripe shape elongating in one direction. The openings 181b are separated from one another and have a stripe shape elongating in a direction crossing (for example, perpendicular to) the openings 181a.

In the embodiment of the invention, the irradiation location of the laser beam is the same as the formation location of the impurity region 20, and thus the impurity region 20 is selectively or locally formed on the front surface of the substrate 110. Alternatively, the impurity region 20 may be coated on the entire front surface of the substrate 110, and then the laser beam may be selectively irradiated only onto desired portions of the impurity region 20. Subsequently, the remaining impurity region 20 may be removed using deionized water (DI). In this instance, the second emitter region 1212 is formed under the impurity region 20, onto which the laser beam is irradiated.

Figure 10I:
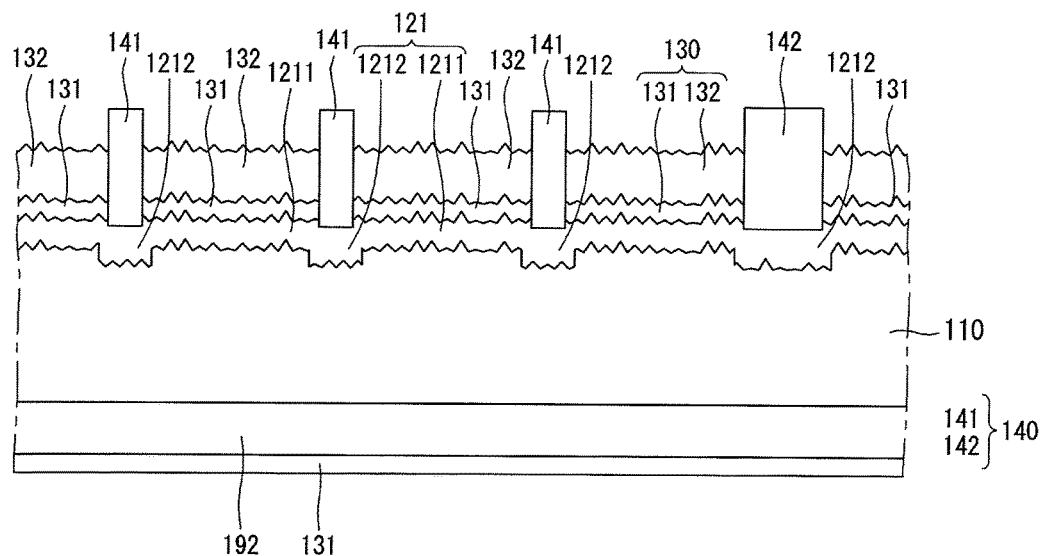

Next, as shown in FIG. 10I, a front electrode part 140, which is formed of a metal material and includes the plurality of front electrodes 141 and the plurality of front bus bars 142, is formed on the second emitter region 1212 exposed by the openings 181a and 181b using a plating method.

The front electrodes 141 are formed in the openings 181a, and the front bus bars 142 are formed in the openings 181b.

After a seed layer for smoothly performing a plating process on each front electrode 141 and each front bus bar 142 is formed in each of the openings 181a and 181b, the plating process may be performed on the seed layer.

In another embodiment, the front electrodes 141 and the front bus bars 142 may be formed by forming a metal paste containing a metal material in the openings 181a and 181b using a screen printing method.

As described above, the impurity region 20 is formed on the emitter layer 120, and then the irradiation operation of the laser beam is once performed on the impurity region 20. Hence, the openings 181a and 181b for the second emitter region 1212 and the front electrode part 140 are simultaneously formed without a separate thermal process. As a result, the solar cell may be manufactured through a simple process.

Figure 10J:
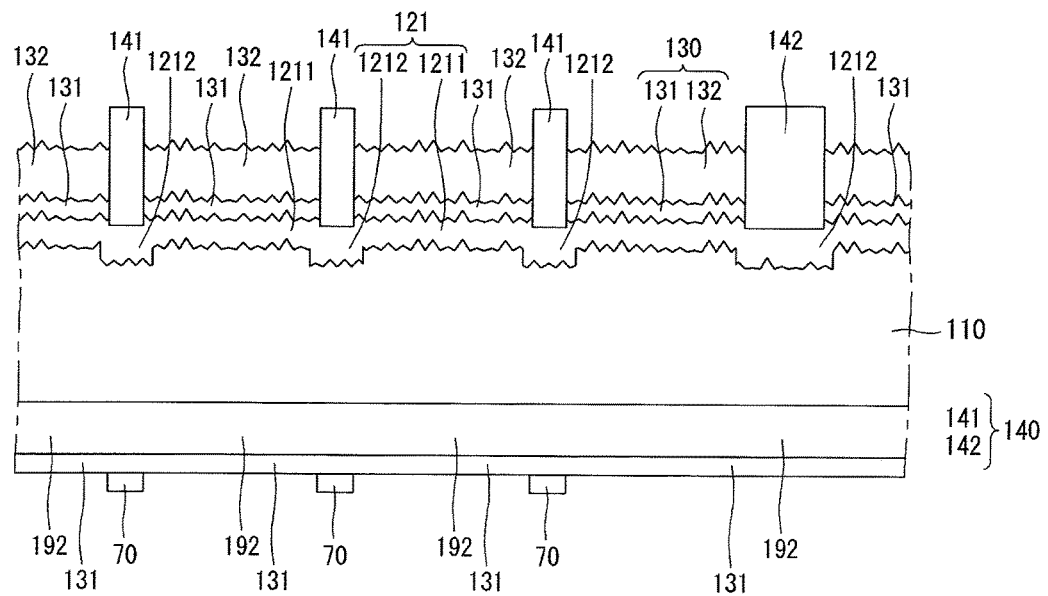

Next, as shown in FIG. 10J, impurities of the same conductive type (i.e., the first conductive type) as the substrate 110 are selectively or locally doped on the first anti-reflection layer 131 on the back surface of the substrate 110 to form an impurity region (or layer) 70 in the same manner as the process illustrated in FIG. 10G. The impurity region 70 may be formed using the inkjet method or the screen printing method.

Figure 10K:
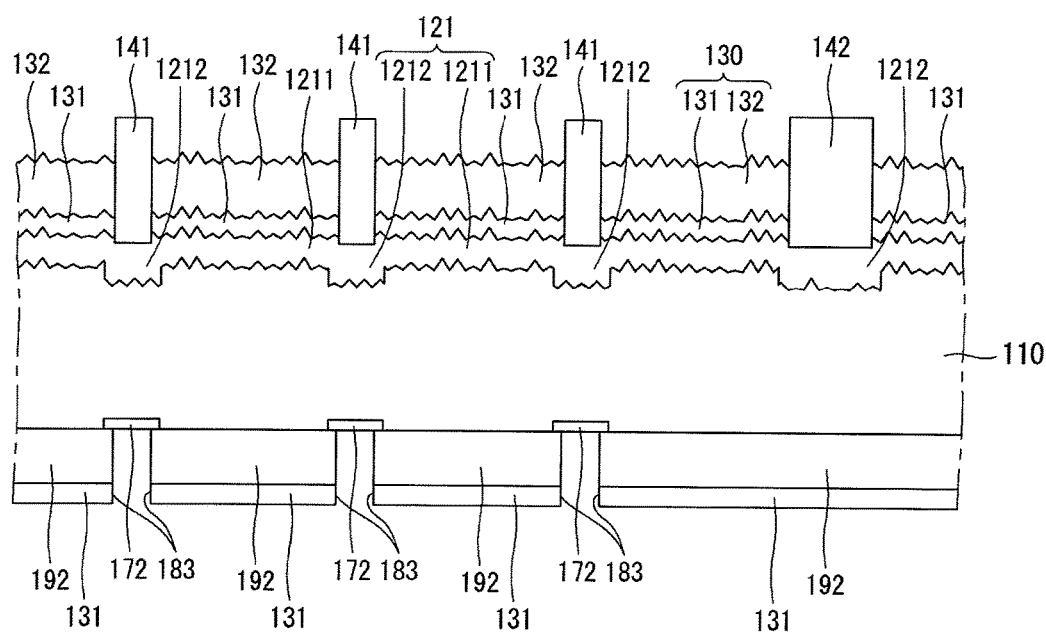

Next, as in the process illustrated in FIG. 10H, the laser beam is irradiated onto the impurity region 70, and a region of the substrate 110 underlying the impurity region 70, onto which the laser beam is irradiated, is additionally doped with p-type impurities. Hence, a plurality of back surface field regions 172 are formed. Further, as shown in FIG. 10K, a plurality of openings (or second openings) 183, which partially pass through the first anti-reflection layer 131 and the passivation layer 192 underlying the impurity region 70 and expose the back surface field regions 172, are formed. Accordingly, the plurality of back surface field regions 172 and the plurality of openings 183 are simultaneously formed through one irradiation operation of the laser beam.

Each of the back surface field regions 172 may have an island shape or a stripe shape depending on an irradiation shape of the laser beam. Each of the openings 183 has the same shape as each of the exposed back surface field regions 172.

Thus, each opening 183 may have a dot shape such as a circle, an oval, and a polygon or may have a stripe shape elongating in a fixed direction (for example, an extending direction of the front electrodes 141).

In the embodiment of the invention, the irradiation location of the laser beam is the same as the formation location of the impurity region 70, and thus the impurity region 70 is selectively or locally formed on the back surface of the substrate 110. Alternatively, the impurity region 70 may be coated on the entire back surface of the substrate 110, and then the laser beam may be selectively irradiated only onto desired portions of the impurity region 70. Subsequently, the remaining impurity region 70 may be removed using deionized water (DI), etc. In this instance, the back surface field regions 172 are formed only at the back surface of the substrate 110 underlying the impurity region 70, onto which the laser beam is irradiated.

Next, a plurality of back electrodes 151 (refer to FIGS. 1 to 3) are formed in the openings 183 using the plating method or the screen printing method in the same manner as the formation method of the front electrode part 140.

More specifically, when the back electrodes 151 are formed using the plating method, a seed layer is formed and then an electroplating method or an electroless plating method may be performed.

The back electrodes 151 may be formed of silver (Ag), aluminum (Al), or copper (Cu).

If the solar cell includes a plurality of back bus bars connected to the back electrodes 151, the openings 183 may be additionally formed at a formation location of the back bus bars. Then, the plurality of back bus may be formed in the openings 183 for the back bus bars in the same manner as the formation method of the back electrodes 151.

When the solar cell includes a back reflection layer 161 on the back surface of the substrate 110 as shown in FIGS. 6 and 7, the back reflection layer 161 is formed on the first anti-reflection layer 131 on the back surface of the substrate 110 and on the back electrodes 151 after forming the back electrodes 151. Hence, the solar cell shown in FIGS. 6 and 7 is completed.

The back reflection layer 161 may be formed using the sputtering method or the plating method. The back reflection layer 161 may have a thickness of about 1,000 Å to 3,000 Å. The back reflection layer 161 may be formed of a metal material such as aluminum (Al), silver (Ag), an alloy (Al:Ag) of aluminum (Al) and silver (Ag), and an Al alloy.

In another embodiment, the back surface field regions 172 may be formed separately from the openings 183.

Figure 11A:
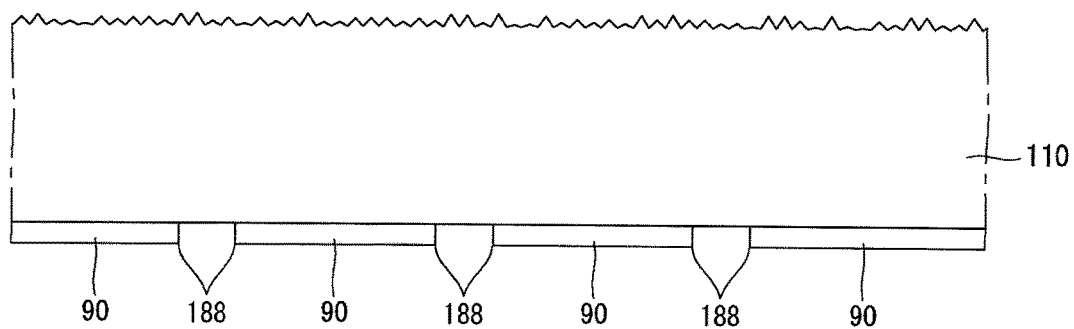
FIGS. 11A to 11C partially illustrate another method for manufacturing a solar cell according to an example embodiment of the invention.
Figure 11B:
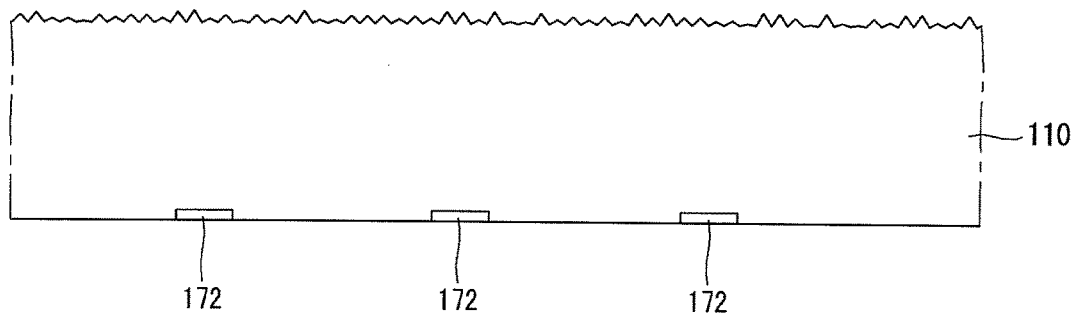

For example, as shown in FIG. 11A, a doping prevention layer 90 having a plurality of openings 188 partially exposing the back surface of the substrate 110 is formed on the back surface of the substrate 110. Subsequently, impurities containing phosphorus (P) are injected only into portions of the back surface of the substrate 110 exposed by the openings 188 of the doping prevention layer 90 using POCl$_3$ gas, etc., to selectively or locally form the back surface field regions 172 at the back surface of the substrate 110. Next, as shown in FIG. 11B, the doping prevention layer 90 is removed using deionized water (DI). In this instance, the doping prevention layer 90 may be a silicon oxide layer and may be formed using the PECVD method. As described above, because the back surface field regions 172 are formed through a separate process, an impurity doping concentration, a doping location, etc., of each of the back surface field regions 172 are more accurately controlled.

The formation location and the shape of the back surface field regions 172 are determined depending on the formation location and the shape of the openings 188.

Figure 11C:
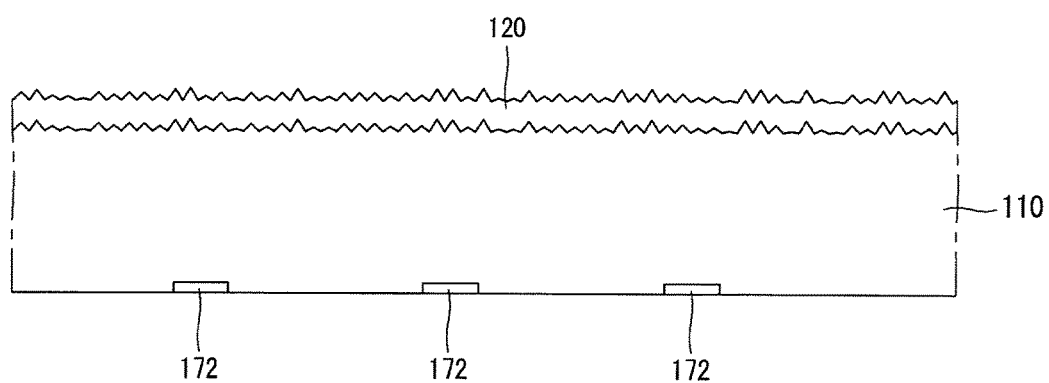

Next, as shown in FIG. 11C, the emitter layer 120 is formed on the front surface of the substrate 110 in the same manner as the method described above.

Formation order of the emitter layer 120 and the back surface field regions 172 may vary.

Next, as described above with reference to FIGS. 10D to 10I, the emitter region 121 including the first and second emitter regions 1211 and 1212, the anti-reflection layer 130 including the first and second anti-reflection layers 131 and 132, and the front electrode part 140 including the plurality of front electrodes 141 and the plurality of front bus bars 142 are formed at the front surface of the substrate 110.

Next, the laser beam is selectively irradiated onto the first anti-reflection layer 131 positioned on the back surface of the substrate 110 to remove a portion of the first anti-reflection layer 131 and a portion of the passivation layer 192 underlying the first anti-reflection layer 131. Thus, a plurality of openings, which pass through the first anti-reflection layer 131 and the passivation layer 192 and expose the back surface field regions 172, are formed in the portion of the first anti-reflection layer 131 and the portion of the passivation layer 192, onto which the laser beam is irradiated. In this instance, the laser beam is irradiated onto the formation location of the back surface field regions 172.

Next, as described above, the plurality of back electrodes 151 are formed in the openings using the plating method, etc.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a substrate having a first type conductivity, and having a first surface, a second surface opposite the first surface, and a third surface that is other than the first surface and the second surface;
an emitter region positioned at the first surface, the emitter region forming a p-n junction along with the substrate, the emitter region having a second type conductivity opposite of the first type conductivity;
a plurality of surface field regions locally positioned at the second surface, the plurality of surface field regions having the first type conductivity more heavily doped than that of the substrate;
a plurality of first electrodes positioned on the emitter region to be separated from one another and connected to the emitter region;
a plurality of second electrodes positioned on the plurality of surface field regions to be separated from one another and connected to the plurality of surface field regions;
a first anti-reflection layer positioned on the first surface, the second surface, and the third surface, the first anti-reflection layer being formed of aluminum oxide and having negative fixed charges;
a second anti-reflection layer positioned on the first anti-reflection layer at the first surface and the third surface, the second anti-reflection layer being formed of silicon nitride and having positive fixed charges;
a passivation layer positioned between the second surface and the first anti-reflection layer, the passivation layer being formed of silicon nitride and having positive fixed charges,
wherein the passivation layer is formed directly between the second surface and the first anti-reflection layer,
wherein the first anti-reflection layer is formed directly between the third surface and the second anti-reflection layer,
wherein each of the first anti-reflection layer and the passivation layer has a plurality of openings, where the plurality of second electrodes penetrate through the plurality of openings of each of the first anti-reflection layer and the passivation layer to connect to the plurality of back surface field regions positioned at the second surface,
wherein each of the passivation layer and the first anti-reflection layer are positioned on the entire second surface except for where the plurality of openings are positioned, and
wherein the first anti-reflection layer continuously wraps around from the first surface to the third surface, and continuously wraps around from the third surface to the second surface.

2. The solar cell of claim 1, wherein each of the plurality of surface field regions has a dot shape.

3. The solar cell of claim 2, wherein a pitch between two adjacent surface field regions of the plurality of surface field regions is about 0.03 mm to 0.11 mm.

4. The solar cell of claim 1, wherein the plurality of surface field regions each has a stripe shape extending in a fixed direction.

5. The solar cell of claim 4, wherein a pitch between two adjacent surface field regions of the plurality of surface field regions is about 0.1 mm to 0.6 mm.

6. The solar cell of claim 4, wherein at least one of the first and second surfaces is an incident surface.

7. The solar cell of claim 1, further comprising a reflection layer positioned on the plurality of second electrodes and between adjacent second electrodes.

8. The solar cell of claim 7, wherein the reflection layer is formed of a metal material.

9. The solar cell of claim 8, wherein the metal material is aluminum (Al), silver (Ag), an alloy (Al:Ag) of aluminum (Al) and silver (Ag), an Al alloy, or copper (Cu).

10. The solar cell of claim 8, wherein the first surface is an incident surface, and the second surface is a non-incident surface.

11. The solar cell of claim 1, wherein the emitter region includes a first emitter region having a first sheet resistance and a second emitter region having a second sheet resistance, and
wherein the first sheet resistance of the first emitter region is about 80Ω/sq. to 150Ω/sq., and the second sheet resistance of the second emitter region is about 30Ω/sq. to 70Ω/sq.

12. The solar cell of claim 1, wherein the emitter region includes a first emitter region and a second emitter region, and
wherein the first emitter region has a first thickness and the second emitter region has a second thickness greater than the first thickness.

13. The solar cell of claim 12, wherein the first thickness of the first emitter region is about 200 nm to 500 nm, and the second thickness of the second emitter region is about 400 nm to 700 nm.

14. The solar cell of claim 1, wherein each of the plurality of surface field regions has a sheet resistance of about 15Ω/sq. to 45Ω/sq.

15. The solar cell of claim 1, wherein the second anti-reflection layer has a thickness of about 70 nm to 80 nm and a refractive index of about 2.0 to 2.2.

16. The solar cell of claim 1, wherein the passivation layer has a thickness of about 70 nm to 80 nm and a refractive index of about 2.0 to 2.2.

17. The solar cell of claim 1, wherein the first anti-reflection layer has a thickness of about 5 nm to 10 nm and a refractive index of about 1.1 to 1.6.

18. The solar cell of claim 1, wherein the substrate is formed of single crystal silicon, and
wherein the first type conductivity is n-type and the second type conductivity is p-type.

19. The solar cell of claim 1, wherein the second anti-reflection layer is not positioned on the first anti-reflection layer on the second surface.

* * * * *